(12) United States Patent
Shishido et al.

(10) Patent No.: US 12,021,094 B2
(45) Date of Patent: *Jun. 25, 2024

(54) IMAGING DEVICE INCLUDING PHOTOELECTRIC CONVERTERS AND CAPACITOR

(71) Applicant: Panasonic Intellectual Property Management Co., Ltd., Osaka (JP)

(72) Inventors: Sanshiro Shishido, Osaka (JP); Masashi Murakami, Kyoto (JP); Kazuko Nishimura, Kyoto (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/077,127

(22) Filed: Dec. 7, 2022

(65) Prior Publication Data

US 2023/0097274 A1 Mar. 30, 2023

Related U.S. Application Data

(63) Continuation of application No. 16/886,621, filed on May 28, 2020, now Pat. No. 11,552,115, which is a
(Continued)

(30) Foreign Application Priority Data

Jan. 29, 2016 (JP) .................. 2016-015821

(51) Int. Cl.
*H01L 27/146* (2006.01)
*H04N 25/57* (2023.01)
(Continued)

(52) U.S. Cl.
CPC .. *H01L 27/14612* (2013.01); *H01L 27/14609* (2013.01); *H01L 27/14627* (2013.01);
(Continued)

(58) Field of Classification Search
None
See application file for complete search history.

(56) References Cited

U.S. PATENT DOCUMENTS

| 4,647,975 A | 3/1987 | Alston et al. |
| 6,777,660 B1 | 8/2004 | Lee |
| (Continued) | | |

FOREIGN PATENT DOCUMENTS

| CN | 103855174 A | 6/2014 |
| JP | S52-108678 A | 9/1977 |
| (Continued) | | |

OTHER PUBLICATIONS

Notice of Allowance issued in U.S. Appl. No. 16/045,553, dated Mar. 3, 2020.
(Continued)

*Primary Examiner* — Jennifer D Bennett
*Assistant Examiner* — Erin R Garber
(74) *Attorney, Agent, or Firm* — Rimon P.C.

(57) ABSTRACT

An imaging device that includes a semiconductor substrate; a first photoelectric converter that is located in the semiconductor substrate and that generates a first signal charge by photoelectric conversion; a first node to which the first signal charge is input; a capacitor having a first terminal coupled to the first node; a second photoelectric converter that is located in the semiconductor substrate and that generates a second signal charge by photoelectric conversion; a second node to which the second signal charge is input; a transistor having a gate coupled to the second node; and a switch element coupled between the first node and the
(Continued)

second node, where a number of saturation charges of a first imaging cell including the first photoelectric converter and the capacitor is greater than a number of saturation charges of a second imaging cell including the second photoelectric converter.

19 Claims, 24 Drawing Sheets

Related U.S. Application Data continuation of application No. 16/045,553, filed on Jul. 25, 2018, now Pat. No. 10,707,248, which is a continuation of application No. 15/408,593, filed on Jan. 18, 2017, now Pat. No. 10,062,718.

(51) Int. Cl.
*H04N 25/585* (2023.01)
*H04N 25/75* (2023.01)
*H04N 25/76* (2023.01)
*H04N 23/50* (2023.01)
*H04N 23/55* (2023.01)

(52) U.S. Cl.
CPC ....... *H01L 27/14643* (2013.01); *H04N 25/57* (2023.01); *H04N 25/585* (2023.01); *H04N 25/75* (2023.01); *H04N 25/76* (2023.01); *H04N 23/50* (2023.01); *H04N 23/55* (2023.01)

(56) References Cited

U.S. PATENT DOCUMENTS

| | | | |
|---|---|---|---|
| 8,917,342 | B2 | 12/2014 | Ohta |
| 9,967,501 | B2 | 5/2018 | Tamaki |
| 10,062,718 | B2 | 8/2018 | Shishido et al. |
| 10,375,332 | B2 | 8/2019 | Nishimura et al. |
| 10,707,248 | B2 | 7/2020 | Shishido et al. |
| 10,904,464 | B2 | 1/2021 | Nishimura et al. |
| 11,172,155 | B2 | 11/2021 | Tamaki |
| 11,637,976 | B2* | 4/2023 | Nishimura ........ H01L 27/14614 348/300 |
| 2003/0038890 | A1 | 2/2003 | Yamada |
| 2004/0169125 | A1 | 9/2004 | Yamada |
| 2005/0035271 | A1 | 2/2005 | Kochi et al. |
| 2005/0040320 | A1 | 2/2005 | Lule et al. |
| 2005/0092894 | A1 | 5/2005 | Fossum |
| 2005/0151873 | A1 | 7/2005 | Murakami |
| 2005/0225655 | A1 | 10/2005 | Suzuki |
| 2006/0119720 | A1 | 6/2006 | Hong |
| 2006/0274176 | A1 | 12/2006 | Guidash |
| 2007/0290238 | A1 | 12/2007 | Adachi |
| 2008/0030605 | A1 | 2/2008 | Tsukimura |
| 2008/0192134 | A1 | 8/2008 | Mori et al. |
| 2008/0211954 | A1 | 9/2008 | Ota |
| 2008/0297609 | A1 | 12/2008 | Song et al. |
| 2009/0026563 | A1 | 1/2009 | Katsuno et al. |
| 2009/0045319 | A1 | 2/2009 | Sugawa et al. |
| 2010/0002110 | A1 | 1/2010 | Ota |
| 2011/0001861 | A1 | 1/2011 | Tanaka et al. |
| 2011/0036969 | A1 | 2/2011 | Ahn et al. |
| 2011/0049591 | A1 | 3/2011 | Nakatani et al. |
| 2011/0049661 | A1 | 3/2011 | Maehara et al. |
| 2011/0049665 | A1 | 3/2011 | Goto |
| 2011/0074995 | A1 | 3/2011 | Rafferty et al. |
| 2011/0109776 | A1 | 5/2011 | Kawai |
| 2011/0121162 | A1 | 5/2011 | Murata et al. |
| 2011/0181747 | A1 | 7/2011 | Kido et al. |
| 2011/0199106 | A1 | 8/2011 | Lotto et al. |
| 2011/0242381 | A1 | 10/2011 | Sakakibara et al. |
| 2012/0188424 | A1 | 7/2012 | Li |
| 2013/0033631 | A1 | 2/2013 | Mabuchi |
| 2013/0043399 | A1* | 2/2013 | Rohr ........................ G01T 1/243 250/366 |
| 2013/0076953 | A1* | 3/2013 | Sekine ................ G06F 3/04883 348/311 |
| 2013/0107094 | A1 | 5/2013 | Yamamoto et al. |
| 2013/0182173 | A1 | 7/2013 | Murata |
| 2013/0242087 | A1 | 9/2013 | Kanemitsu et al. |
| 2013/0258149 | A1 | 10/2013 | Choi et al. |
| 2013/0313410 | A1 | 11/2013 | Goto |
| 2013/0314574 | A1 | 11/2013 | Ishii et al. |
| 2013/0341491 | A1 | 12/2013 | Hirose et al. |
| 2014/0027618 | A1 | 1/2014 | Goto |
| 2014/0043510 | A1 | 2/2014 | Kasuga et al. |
| 2014/0145068 | A1 | 5/2014 | Meynants |
| 2014/0151531 | A1 | 6/2014 | Yamashita |
| 2014/0219422 | A1 | 8/2014 | Nishino et al. |
| 2014/0246561 | A1 | 9/2014 | Chen et al. |
| 2014/0346321 | A1 | 11/2014 | Kinugasa |
| 2015/0054997 | A1 | 2/2015 | Hynecek |
| 2015/0222833 | A1 | 8/2015 | Murata |
| 2015/0358570 | A1 | 12/2015 | Taniguchi |
| 2016/0035920 | A1 | 2/2016 | Tashiro et al. |
| 2016/0105622 | A1 | 4/2016 | Tamaki |
| 2016/0156862 | A1* | 6/2016 | Yoshimura ........... H04N 25/585 348/308 |
| 2016/0190187 | A1 | 6/2016 | Nishimura et al. |
| 2016/0190188 | A1 | 6/2016 | Murakami et al. |
| 2016/0191825 | A1 | 6/2016 | Sato et al. |
| 2016/0219233 | A1 | 7/2016 | Murata |
| 2016/0261814 | A1 | 9/2016 | Ueda et al. |
| 2016/0293654 | A1 | 10/2016 | Tomekawa et al. |
| 2016/0360131 | A1 | 12/2016 | Shimasaki et al. |
| 2017/0150017 | A1 | 5/2017 | Geurts et al. |
| 2017/0214871 | A1 | 7/2017 | Kanehara et al. |
| 2017/0221947 | A1 | 8/2017 | Shishido et al. |
| 2017/0324916 | A1 | 11/2017 | Sugawa et al. |
| 2018/0124335 | A1 | 5/2018 | Machida et al. |
| 2018/0191973 | A1 | 7/2018 | Hirota |
| 2018/0241955 | A1 | 8/2018 | Sakano et al. |
| 2018/0308883 | A1 | 10/2018 | Yanagita et al. |
| 2019/0260954 | A1 | 8/2019 | Tamaki |

FOREIGN PATENT DOCUMENTS

| | | |
|---|---|---|
| JP | S62-108678 A | 5/1987 |
| JP | S63-266875 A | 11/1988 |
| JP | 2004-320119 A | 11/2004 |
| JP | 2006-509353 A | 3/2006 |
| JP | 2006-216907 A | 8/2006 |
| JP | 2007-059465 A | 3/2007 |
| JP | 2008-099073 A | 4/2008 |
| JP | 2008-546313 A | 12/2008 |
| JP | 2011-015219 A | 1/2011 |
| JP | 2011-166792 A | 8/2011 |
| JP | 2012-019167 A | 1/2012 |
| JP | 2013-030820 A | 2/2013 |
| JP | 2013-034045 A | 2/2013 |
| JP | 2013-070245 A | 4/2013 |
| JP | 2014-230212 A | 12/2014 |
| JP | 2015-146650 A | 8/2015 |
| JP | 2015-231095 A | 12/2015 |
| JP | 2017-084892 A | 5/2017 |
| WO | 2004/051980 A1 | 6/2004 |
| WO | 2009/136285 A2 | 11/2009 |
| WO | 2012/147302 A1 | 11/2012 |
| WO | 2016/147885 A1 | 9/2016 |

OTHER PUBLICATIONS

Final Office Action issued in U.S. Appl. No. 16/045,553, dated Nov. 15, 2019.

Non-Final Office Action issued in U.S. Appl. No. 16/045,553, dated Jun. 14, 2019.

Non-Final Office Action issued in U.S. Appl. No. 15/406,593, dated Nov. 3, 2017.

Notice of Allowance issued in U.S. Appl. No. 15/408,593, dated Apr. 27, 2018.

Non-Final Office Action dated Sep. 15, 2016, issued in U.S. Appl. No. 14/857,699.

(56) References Cited

OTHER PUBLICATIONS

Final Office Action dated Apr. 12, 2017, issued in U.S. Appl. No. 14/857,699.
Non-Final Office Action dated Jul. 24, 2017, issued in U.S. Appl. No. 14/857,699.
Notice of Allowance dated Jan. 22, 2018, issued in U.S. Appl. No. 14/857,699.
Notice of Allowance issued in related U.S. Appl. No. 15/946,448 dated Sep. 26, 2018.
Non-Final Office Action issued in related U.S. Appl. No. 15/946,448 dated May 14, 2018.
Notice of Allowance issued in U.S. Appl. No. 16/232,633, dated Feb. 4, 2019.
Non-Final Office Action issued in U.S. Appl. No. 16/447,148, dated Dec. 12, 2019.
Final Office Action issued in U.S. Appl. No. 16/447,148, dated Jun. 18, 2020.
Notice of Allowance issued in U.S. Appl. No. 16/447,148, dated Oct. 5, 2020.
Non-Final Office Action issued in U.S. Appl. No. 15/408,593, dated Nov. 3, 2017.
Non-Final Office Action issued in U.S. Appl. No. 16/886,621, dated Apr. 8, 2022.
Notice of Allowance issued in U.S. Appl. No. 16/886,621, dated Sep. 9, 2022.
English Translation of Chinese Search Report dated May 19, 2022 for the related Chinese Patent Application No. 202110207898.X.

* cited by examiner

IMAGING DEVICE INCLUDING PHOTOELECTRIC CONVERTERS AND CAPACITOR

This application is a Continuation Application of U.S. application Ser. No. 16/886,621 filed on May 28, 2020, which is a Continuation Application of U.S. application Ser. No. 16/045,553, now U.S. Pat. No. 10,707,248, filed on Jul. 25, 2018, which is a Continuation Application of U.S. application Ser. No. 15/408,593, now U.S. Pat. No. 10,062,718, filed on Jan. 18, 2017, which claims the benefit of Japanese Application No. 2016-015821 filed on Jan. 29, 2016, the entire contents of each are hereby incorporated by reference.

BACKGROUND

1. Technical Field

The present disclosure relates to an imaging device and an imaging module, which are typified by complementary metal-oxide semiconductor (CMOS) image sensors.

2. Description of the Related Art

In the natural world, subjects that have high contrasts exist. For example, for dealing with a subject whose brightness changes from moment to moment, vehicle-mounted imaging devices need to simultaneously image a bright subject and a dark subject (i.e., need to have a high dynamic range). In order to realize a high dynamic range, Japanese Unexamined Patent Application Publication No. 62-108678 (hereinafter referred to as "Patent Document 1") and Japanese Unexamined Patent Application Publication No. 2008-99073 (hereinafter referred to as "Patent Document 2") propose methods as described below.

Imaging devices disclosed in Patent Documents 1 and 2 use silicon photodiodes. In Patent Document 1, images for which exposure times (hereinafter may be referred to as "storage times") differ from each other are combined together to thereby make it possible to obtain a wide dynamic range. This scheme has already been put into practical use. In Patent Document 2", images acquired from pixel cells that are arranged in one pixel and that have different sensitivities are combined together to increase the dynamic range.

SUMMARY

The above-described imaging device in the related art requires a further improvement in high-dynamic-range photography.

In one general aspect, the techniques disclosed here feature an imaging device that includes a semiconductor substrate; a first photoelectric converter that is located in the semiconductor substrate and that generates a first signal charge by photoelectric conversion; a first node to which the first signal charge is input; a capacitor having a first terminal coupled to the first node; a second photoelectric converter that is located in the semiconductor substrate and that generates a second signal charge by photoelectric conversion; a second node to which the second signal charge is input; a transistor having a gate coupled to the second node; and a switch element coupled between the first node and the second node, wherein a number of saturation charges of a first imaging cell including the first photoelectric converter and the capacitor is greater than a number of saturation charges of a second imaging cell including the second photoelectric converter.

It should be noted that general or specific embodiments may be implemented as a system, a method, an integrated circuit, a computer program, a storage medium, or any selective combination thereof.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION

First, a description will be given of problems in the related art which are considered by the present inventors.

In the image combination disclosed in Patent Document 1, a plurality of pieces of image data are obtained in chronological order. Thus, a period of time that is a few times as long as a typical imaging time is required in order to acquire one combined image. In addition, since images having time differences are combined together, simultaneity of images is impaired, thus causing disturbance in images of moving subjects.

In Patent Document 2, a plurality of photodiodes having the same number of saturation electrons and the same size is used. An on-chip top lens is provided to divide the amount of light that is incident on each of the photodiode into two types, that is, a large amount of light and a small amount of light. This configuration can make effective sensitivities appear be different from each other between the pixel cells. Since two pixel cells are provided in one pixel, simultaneous imaging is made possible to ensure the simultaneity of images.

However, since two cells need to be provided in one pixel, the area of each photodiode inevitably becomes one-half or less of that in typical technologies. The area of each photodiode is generally proportional to the sensitivity or the number of saturation electrons. As a result, when the area of each photodiode is one-half or less, the sensitivity and the number of saturation electrons also become one-half or less of the area in typical technologies.

Figure 1:
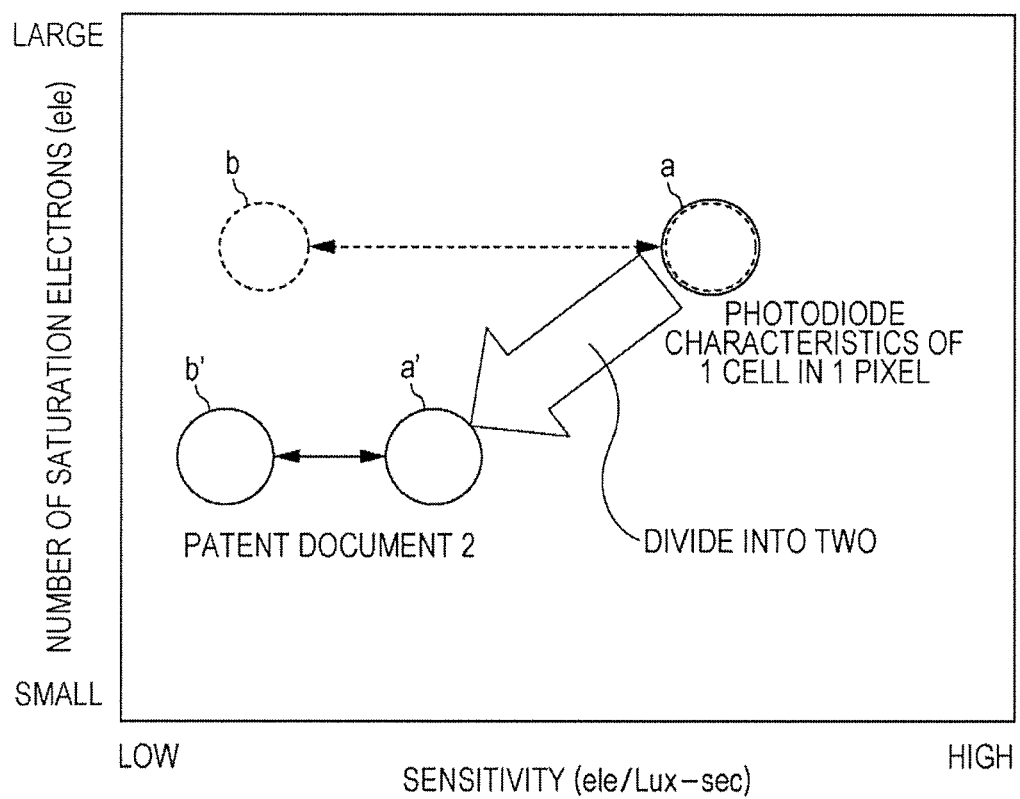
FIG. 1 is a diagram schematically illustrating pixel cell characteristics in the related art and desirable pixel cell characteristics.

FIG. 1 schematically illustrates pixel cell characteristics in the related art and desirable pixel cell characteristics. As opposed to a typical cell having one pixel cell in a single pixel (hereinafter simply referred to as a "typical cell"), two pixel cells in a single pixel are used in high dynamic range (HDR) photography. It is desirable that each of these two pixel cells has (a) pixel cell characteristics in which the sensitivity and the number of saturation electrons are equivalent to those of the typical cell and (b) pixel cell characteristics in which the number of saturation electrons is equivalent to that of the typical cell and the sensitivity is lower than that of the typical cell. In FIG. 1, "a" and "b" represent this desirable combination.

Also "a'" and "b'" in FIG. 1 represent a combination of two pixel cells in Patent Document 2. As described above, the area of each pixel cell (photodiode) is one-half or less of the typical cell. Accordingly, the sensitivity of each pixel cell decreases, and the number of saturation electrons decreases. This means that the characteristics deviate from the desirable characteristics. As described above, the characteristics of the pixel cells in Patent Document 2 are significantly inferior to the requested characteristics.

Figure 2:
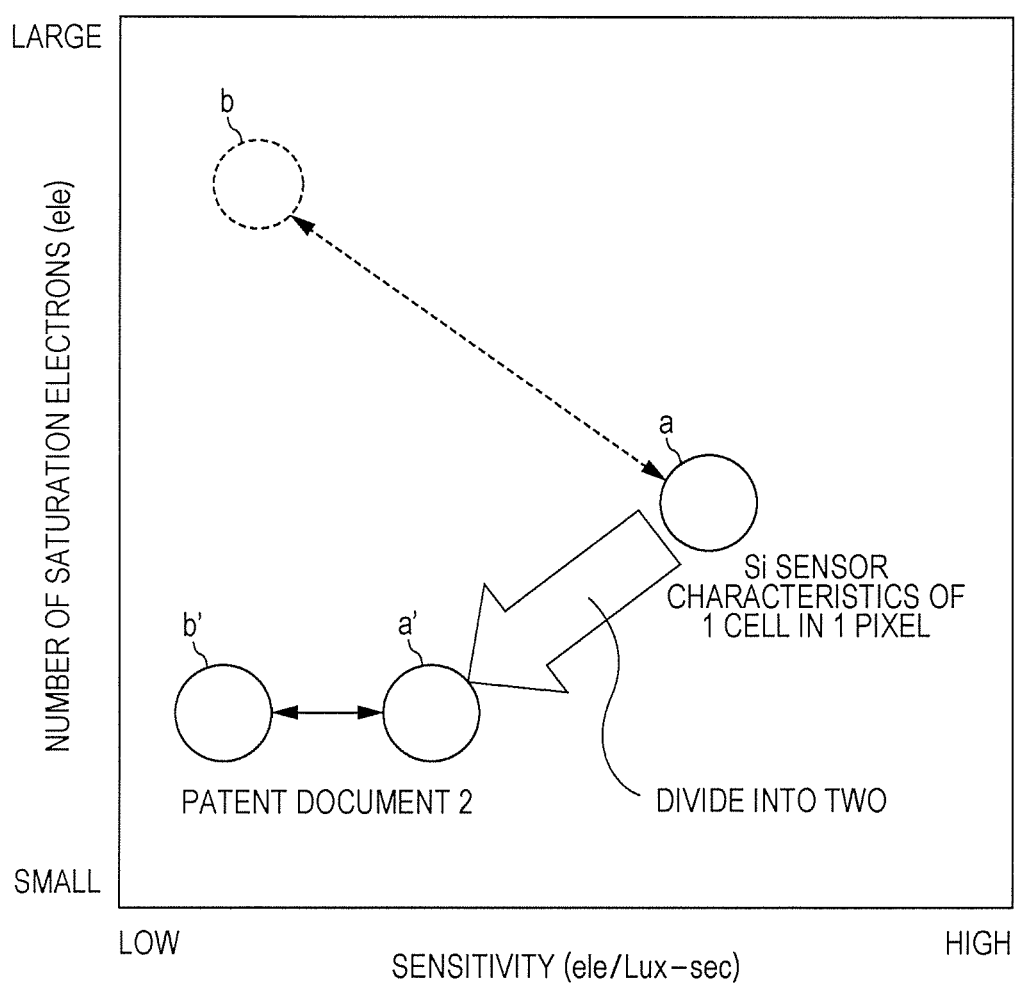
FIG. 2 is a diagram schematically illustrating the pixel cell characteristics in the related art and more desirable pixel cell characteristics.

FIG. 2 schematically illustrates the pixel cell characteristics in the related art and more desirable pixel cell characteristics. As represented by "b" in FIG. 2, saturation that can occur when the amount of incident light is large is reduced by reducing the sensitivity. In addition, when the number of saturation electrons can be increased, the dynamic range increases further.

Embodiments according to the present disclosure will be described below with reference to the accompanying drawings. The present disclosure, however, is not limited to the embodiments. Changes can be made as appropriate without departing from the scope in which advantages of the present disclosure are obtained. In addition, one embodiment can also be combined with another embodiment. In the following description, the same or similar constituent elements are denoted by the same reference numerals. Also, redundant descriptions may be omitted.

First Embodiment

Figure 3:
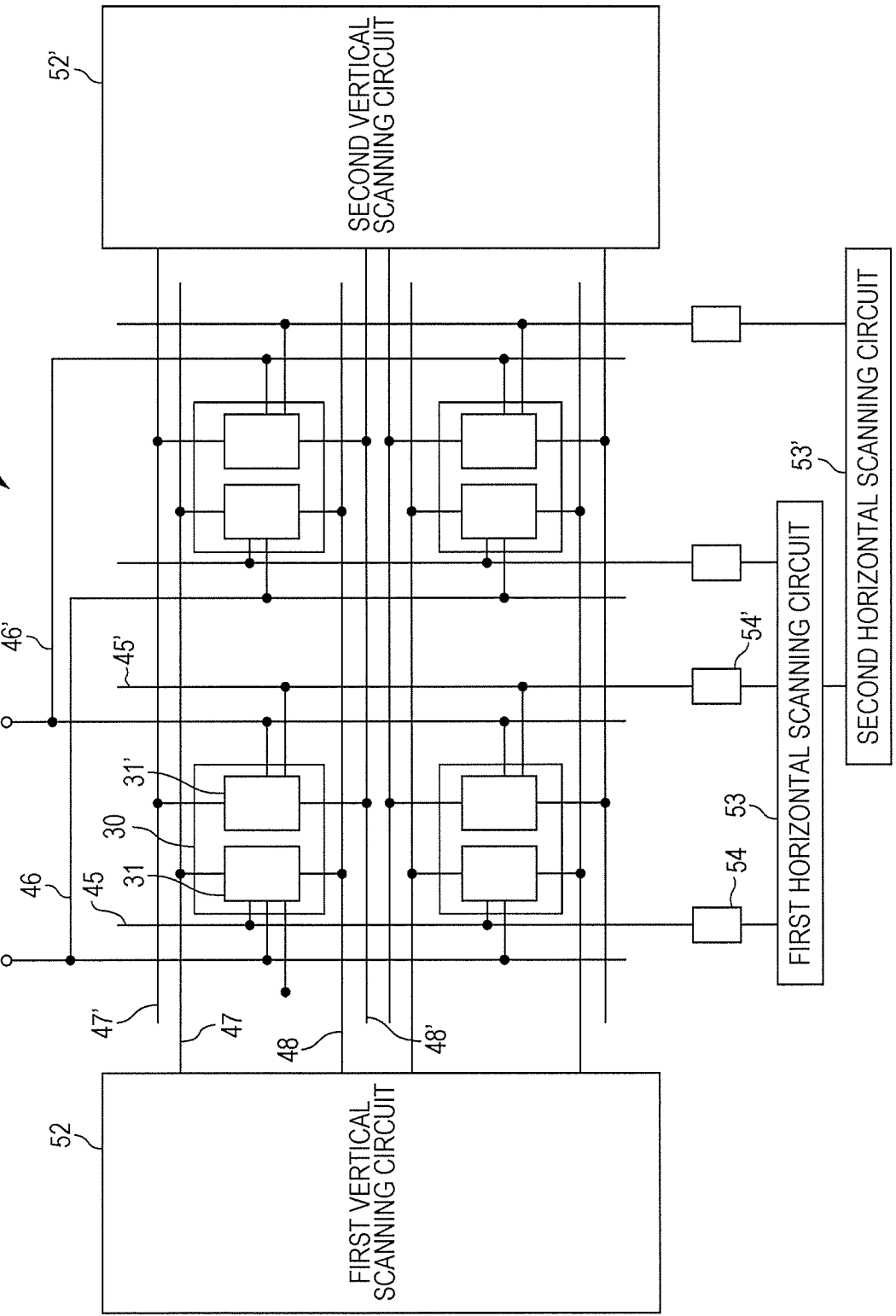
FIG. 3 is a block diagram schematically illustrating one example of the structure of an imaging device according to an exemplary first embodiment.

FIG. 3 schematically illustrates one example of the structure of an imaging device 100. The imaging device 100 has a plurality of unit pixels 30 arranged in two dimensions. In practice, millions of unit pixels 30 are arranged in two dimensions. However, the unit pixels 30 arranged in a matrix of 2 rows and 2 columns are illustrated in FIG. 3. The imaging device 100 may also be a line sensor. In such a case, the unit pixels 30 are arranged in one dimension (in a row direction or a column direction).

Each unit pixel 30 includes a first pixel cell 31 and a second pixel cell 31'. The first pixel cell 31 is a pixel cell corresponding to high saturation. The second pixel cell 31' is a pixel cell corresponding to low noise. Typically, the first pixel cell 31 functions as a pixel cell for low sensitivity, and the second pixel cell 31' functions as a pixel cell for high sensitivity. The imaging device 100 has, for the first pixel cells 31, reset signal lines 47 and address signal lines 48 arranged for each row and vertical signal lines 45 and power-supply lines 46 arranged for each column. The imaging device 100 also has, for the second pixel cells 31', reset signal lines 47' and address signal lines 48' arranged for respective rows and vertical signal lines 45' and power-supply lines 46' arranged for respective columns.

The imaging device 100 has a first peripheral circuit and a second peripheral circuit that are independent of each other. The first peripheral circuit performs processing on signals from the first pixel cells 31, and the second peripheral circuit performs processing on signals from the second pixel cells 31'. The first peripheral circuit has a first vertical scanning circuit 52, a first horizontal scanning circuit 53, and first column analog-to-digital (AD) conversion circuits 54. The second peripheral circuit has a second vertical scanning circuit 52', a second horizontal scanning circuit 53', and second column AD conversion circuits 54'. However, the address signal lines 48 for the first pixel cells 31 and the address signal lines 48' for the second pixel cells 31' can be shared, depending on the configuration of the pixels.

With respect to the first pixel cells 31, the first vertical scanning circuit 52 controls the reset signal lines 47 and the address signal lines 48. The vertical signal lines 45 are connected to the first horizontal scanning circuit 53 to transmit pixel signals to the first horizontal scanning circuit 53. The power-supply lines 46 supply power-supply voltages to all of the corresponding unit pixels 30.

(Circuit Configuration of First Pixel Cell 31 and Second Pixel Cell 31')

Next, an example of the circuit configuration of a first pixel cell 31 and a second pixel cell 31' will be described with reference to FIG. 4.

Figure 4:
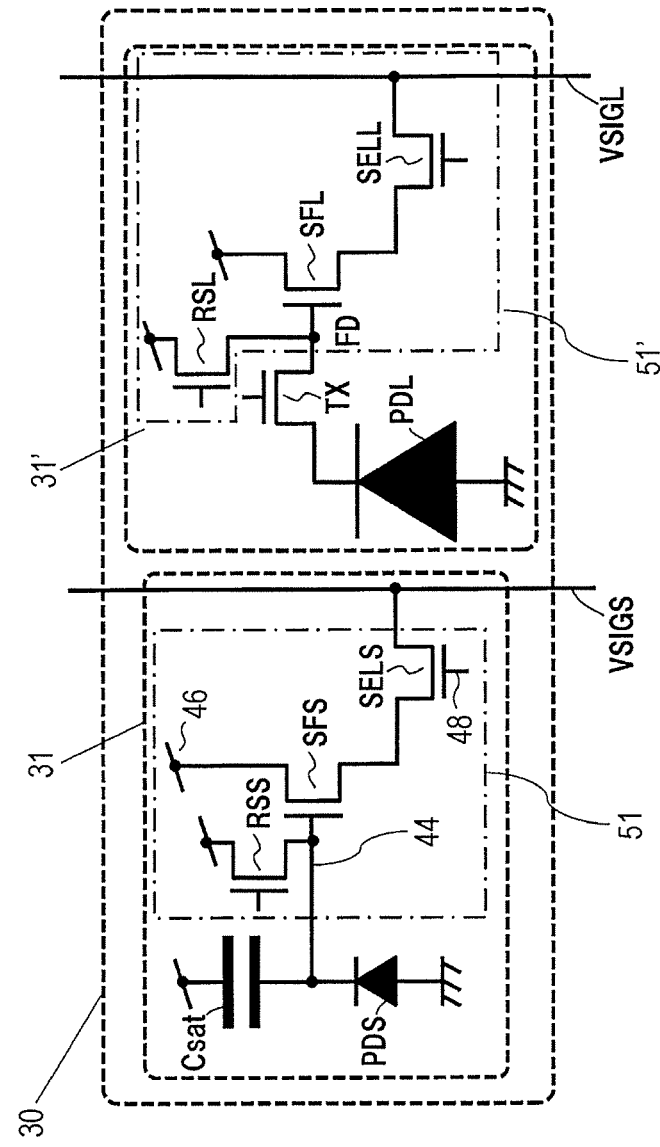
FIG. 4 is a circuit diagram of one unit pixel in the exemplary first embodiment.

FIG. 4 is a circuit diagram of a unit pixel 30 and schematically illustrates the circuit configuration of a first pixel cell 31 and a second pixel cell 31'. The first pixel cell 31 includes a first photoelectric converter PDS and a first charge detection circuit 51. The second pixel cell 31' includes a second photoelectric converter PDL and a second charge detection circuit 51'. The first photoelectric converter PDS and the second photoelectric converter PDL are light-receiving elements and are typically photodiodes (PDs). The first photoelectric converter PDS may have a plane shape that is different from that of the second photoelectric converter PDL. In plan view, the area of the second charge detection circuit 51' is larger than the area of the first charge detection circuit 51.

In the first pixel cell 31 and the second pixel cell 31', the first photoelectric converter PDS, which is provided in a semiconductor substrate, is arranged so as to be smaller than the second photoelectric converter PDL, which is provided in a semiconductor substrate. Accordingly, compared with the first photoelectric converter PDS, the second photoelectric converter PDL generates a large amount of charge for the same amount of incident light and thus has a high sensitivity.

In the first pixel cell 31, the first photoelectric converter PDS is electrically connected to a capacitive element Csat, and a source electrode of a reset transistor RSS and a gate electrode of an amplifying transistor SFS, which serves as an input of a source follower circuit, are connected to a node of the first photoelectric converter PDS and the capacitive element Csat. The reset transistor RSS resets (initializes) charge generated in the first photoelectric converter PDS. In other words, the reset transistor RSS resets a potential of the gate electrode of the amplifying transistor SFS.

The first pixel cell 31 has a so-called three-transistor CMOS image sensor pixel configuration. Heretofore, in a three-transistor pixel configuration, thermal noise, which is called reset noise, is generated by an on-and-off operation of the reset transistor RSS. However, the first pixel cell 31 has a high saturation characteristic that can receive a larger amount of light, by using the capacitive element Csat connected to the first photoelectric converter PDS. When the amount of light is large, optical shot noise is dominant in an acquired image. That is, since optical shot noise becomes larger than circuit noise, an influence of reset noise is small in the first pixel cell 31.

Thus, the first pixel cell 31 can function as a high saturation cell. Since the first pixel cell 31 does not require a transfer transistor, which is required by a known CMOS image sensor, space is correspondingly freed in the silicon substrate. As a result, by using the space, it is possible to ensure the area of the second photoelectric converter PDL in the second pixel cell 31'.

The second pixel cell 31' has the second photoelectric converter PDL, a transfer transistor TX, and a floating diffusion FD. The second photoelectric converter PDL is connected to the floating diffusion (hereinafter referred to simply as "FD") via the transfer transistor TX. The second pixel cell 31' has a so-called four-transistor pixel circuit configuration. Charge generated by the second photoelectric converter PDL is fully transferred to the FD via the transfer transistor TX, and thus, through a correlated double sampling (CDS) operation, noise subtraction can be performed on noise generated by a reset transistor RSL.

As described above, the first pixel cell 31 is made to have low sensitivity characteristic by reducing the area of the photodiode. The first pixel cell 31 is also made to have high saturation characteristic by including the capacitive element Csat in the wiring layer. Since reducing noise is not so highly requested, it is possible to increase the area of the second photoelectric converter PDL in the second pixel cell 31' by reducing the number of elements, such as transistors for noise reduction, fabricated using a silicon substrate.

Since the second pixel cell 31' is a cell for high sensitivity, the area of the photodiode is sufficiently reserved. In addition, when a known transistor configuration is employed, the second pixel cell 31' can have a low noise characteristic.

The first pixel cell 31 images a high-luminance subject, and simultaneously, the second pixel cell 31' images a low-luminance subject. This makes it possible to achieve a wide dynamic range while completely simultaneously performing imaging.

The circuit configuration of the unit pixel 30 will be described below with reference FIGS. 3 and 4 while paying particular attention to the first pixel cell 31.

The first charge detection circuit 51 includes the amplifying transistor SFS, the reset transistor RSS, and an address transistor SELS.

The first photoelectric converter PDS is electrically connected to a source electrode of the reset transistor RSS and a gate electrode of the amplifying transistor SFS. The first photoelectric converter PDS converts light (incident light) incident on the first pixel cell 31 into charge. The first photoelectric converter PDS generates signal charge corresponding to the amount of incident light. The generated signal charge is stored by a charge storage node 44.

The power-supply line 46 is connected to a drain electrode of the amplifying transistor SFS. The power-supply lines 46 are arranged in a column direction. This is due to the following reason. The first pixel cells 31 are selected for each row. Thus, when the power-supply lines 46 are arranged in a row direction, driving currents for all the pixel cells of one row flow to one power-supply line 46, and a large drop in voltage may occurs. A common source follower power-supply voltage is applied to the amplifying transistors SFS in all the first pixel cells 31 through the power-supply lines 46 in the imaging device 100.

The amplifying transistor SFS amplifies a signal voltage corresponding to the amount of the signal charge stored in the corresponding charge storage node 44. A gate electrode of the address transistor SELS is connected to the first vertical scanning circuit 52 through the address signal line 48. A drain electrode of the address transistor SELS is connected to the first horizontal scanning circuit 53 through vertical signal line VSIGS. The vertical signal lines VSIGS and VSIGL correspond to the vertical signal lines 45 and 45', illustrated in FIG. 3, respectively. The address transistor SELS selectively outputs the voltage, which the amplifying transistor SFS outputs, to the vertical signal line VSIGS.

The first vertical scanning circuit 52 applies row selection signals for controlling on and off operations of the address transistors SELS to the gate electrodes of the address transistors SELS. Thus, a row to be read is scanned in a vertical direction (column direction) and is selected. Signal voltage is read out from the first pixel cell 31 in the unit pixel 30 in the selected row to the corresponding vertical signal line VSIGS. Also, the first vertical scanning circuit 52 applies reset signals for controlling on and off operations of the reset transistors RSS to the gate electrodes of the reset transistors RSS. Thus, the first pixel cells 31 in the unit pixels 30 in a row subject to reset operation are selected.

Each first column AD conversion circuit 54 performs, for example, noise suppression signal processing and analog-to-digital conversion (AD conversion), typified by correlated double sampling, on the signals read out from the first pixel cells 31 to the vertical signal line VSIGS for each row. The first horizontal scanning circuit 53 reads the signals processed by the first column AD conversion circuit 54.

In the imaging device 100, random noise may generate during transfer or reset of the signal charge. However, a description herein will be given assuming that the reset noise that generates during reset of the signal charge is random noise. When random noise remains during the reset operation, the remaining random noise is then added to signal charge stored in the charge storage node 44. In this case, when the signal charge is read out, a signal containing random noise is output.

(Device Structure of Unit Pixel 30)

Figure 5:
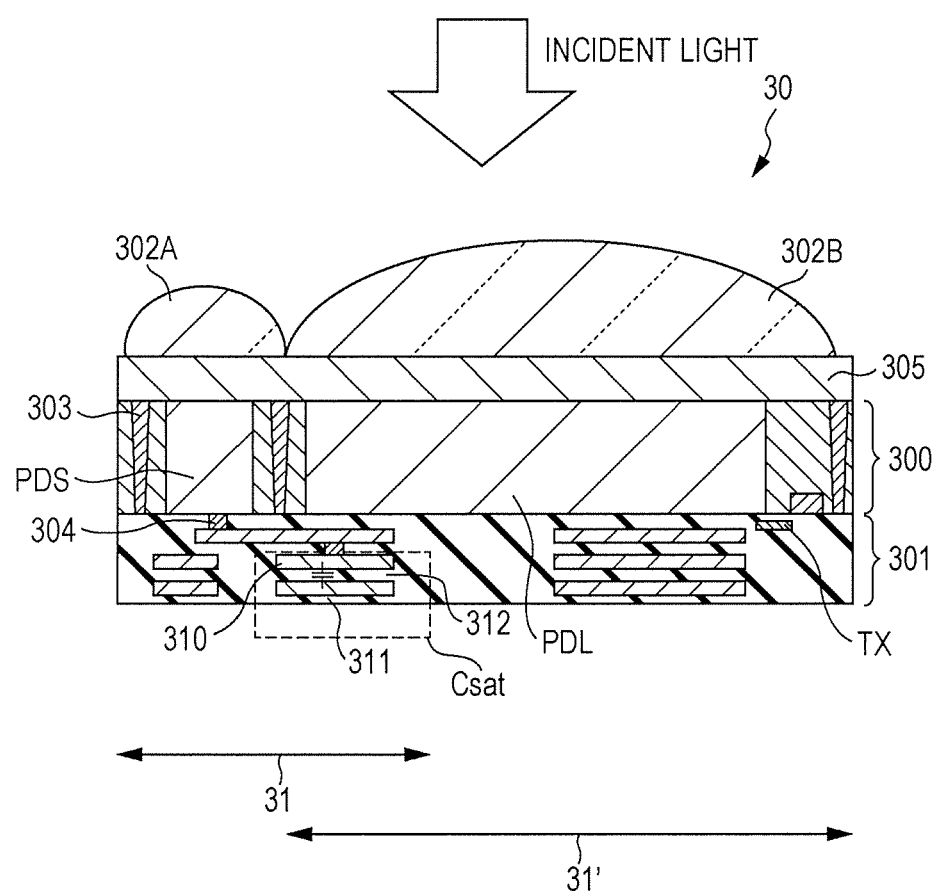
FIG. 5 is a sectional view schematically illustrating the device structure of each unit pixel in the imaging device according to the exemplary first embodiment.

FIG. 5 schematically illustrates a cross section of the device structure of each unit pixel 30 in the imaging device 100 according to the present embodiment.

In the unit pixel 30, the first pixel cell 31 and the second pixel cell 31' are arranged adjacent to each other. The unit pixel 30 typically has an N-type silicon substrate 300 including the first photoelectric converter PDS and the second photoelectric converter PDL, a color filter 305, and microlenses 302A and 302B. The unit pixel 30 includes the first pixel cell 31 and the second pixel cell 31'. However, when monochrome imaging is only performed, the color filter 305 may be eliminated. Also, when light-collecting using microlenses is not performed, the microlenses 302A and 302B may be eliminated. The first photoelectric converter PDS and the second photoelectric converter PDL are generally formed by implanting impurities into a silicon substrate, and the depth and width thereof are not limited to those illustrated in FIG. 5.

In the present embodiment, the sensitivity of the first pixel cell 31 is lower than the sensitivity of the second pixel cell 31'. The microlens 302A entirely covers the first photoelectric converter PDS. The microlens 302B entirely covers the second photoelectric converter PDL. In plan view, the area of the first photoelectric converter PDS is different from the area of the second photoelectric converter PDL. More specifically, the area of the first photoelectric converter PDS is smaller than the area of the second photoelectric converter PDL.

Figure 6:
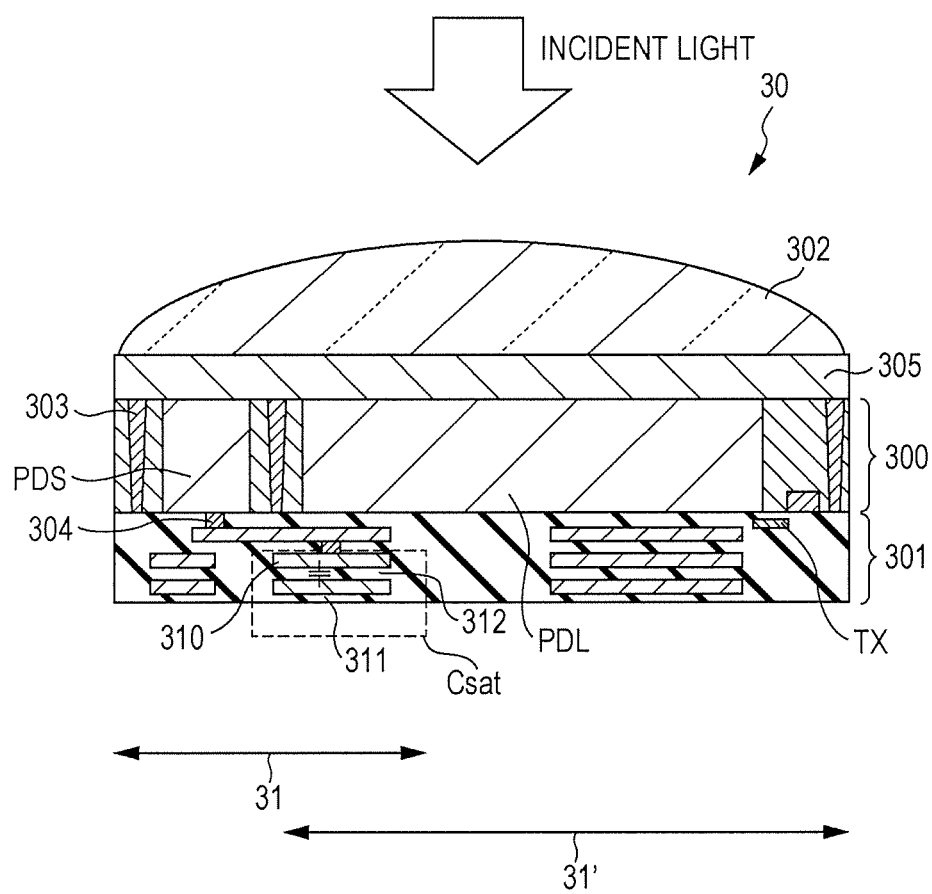
FIG. 6 is a sectional view schematically illustrating another device structure of each unit pixel in the imaging device according to the exemplary first embodiment.
Figure 7:
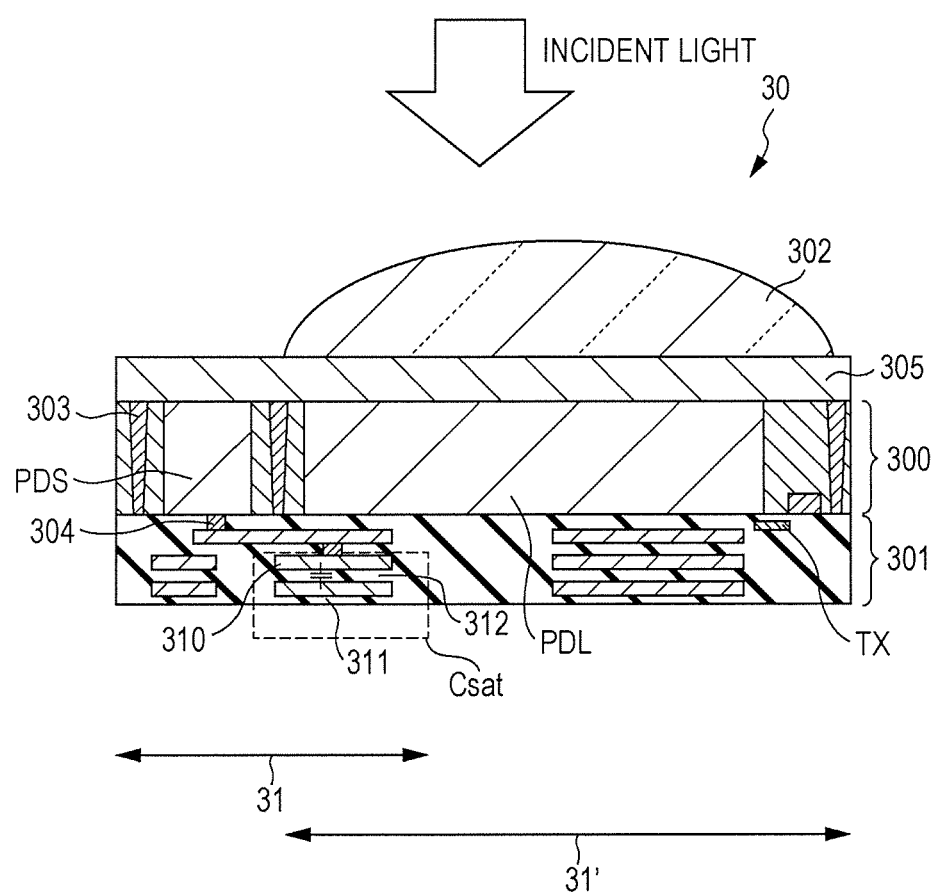
FIG. 7 is a sectional view schematically illustrating another device structure of each unit pixel in the imaging device according to the exemplary first embodiment.

FIGS. 6 and 7 schematically illustrate a cross section of another device structure of each unit pixel 30 in the imaging device 100 according to the present embodiment. As illustrated in FIG. 6, the first pixel cell 31 and the second pixel cell 31' may have a common microlens 302. The microlens 302 focuses light incident on the unit pixel 30 onto the corresponding photoelectric converter. As illustrated in FIG. 7, the microlens 302 may be provided only for the second pixel cell 31', which is a cell for high sensitivity. The second photoelectric converter PDL may be located on an optical axis of the microlens 302.

The first photoelectric converter PDS and the second photoelectric converter PDL may be separated from each other by a shallow trench isolation (STI) layer 303 formed in a silicon substrate. This electrically reduces mixing of colors. However, a configuration that does not have the STI layer 303 can also be selected depending on a purpose, such as miniaturization or the like.

In the present embodiment, difference in sensitivity is caused by difference in size between the first photoelectric converter PDS and the second photoelectric converter PDL. Also, the capacitive element Csat formed in a wiring layer 301 is electrically connected to the charge storage node 44 (see FIG. 4) in the first pixel cell 31 via a contact 304. When the charge storage capacitance is increased by the capacitive element Csat, it is possible to increase the number of saturation electrons in the first pixel cell 31. The first pixel cell 31 functions as a pixel cell corresponding to high saturation. This makes it possible to obtain higher saturation charge at low sensitivity. In other words, it is possible to image a high-luminance subject without saturation. In the present disclosure, the "storage capacitance" refers to all capacitance components connected to a photoelectric converter.

In plan view, the capacitive element Csat is located between the first photoelectric converter PDS and the second photoelectric converter PDL. In plan view, the capacitive element Csat at least partly overlaps one of or both the first photoelectric converter PDS and the second photoelectric converter PDL. The capacitive element Csat may be implemented by a metal insulator metal (MIM) capacitor, which has a parallel-plate capacitor configuration between different wiring layers, as illustrated in FIG. 5. In such a case, the capacitive element Csat includes a lower electrode 311, an upper electrode 310, and an insulator 312 provided between the lower electrode 311 and the upper electrode 310. One of the lower electrode 311 and the upper electrode 310 is electrically connected to the first photoelectric converter PDS.

Figure 8:
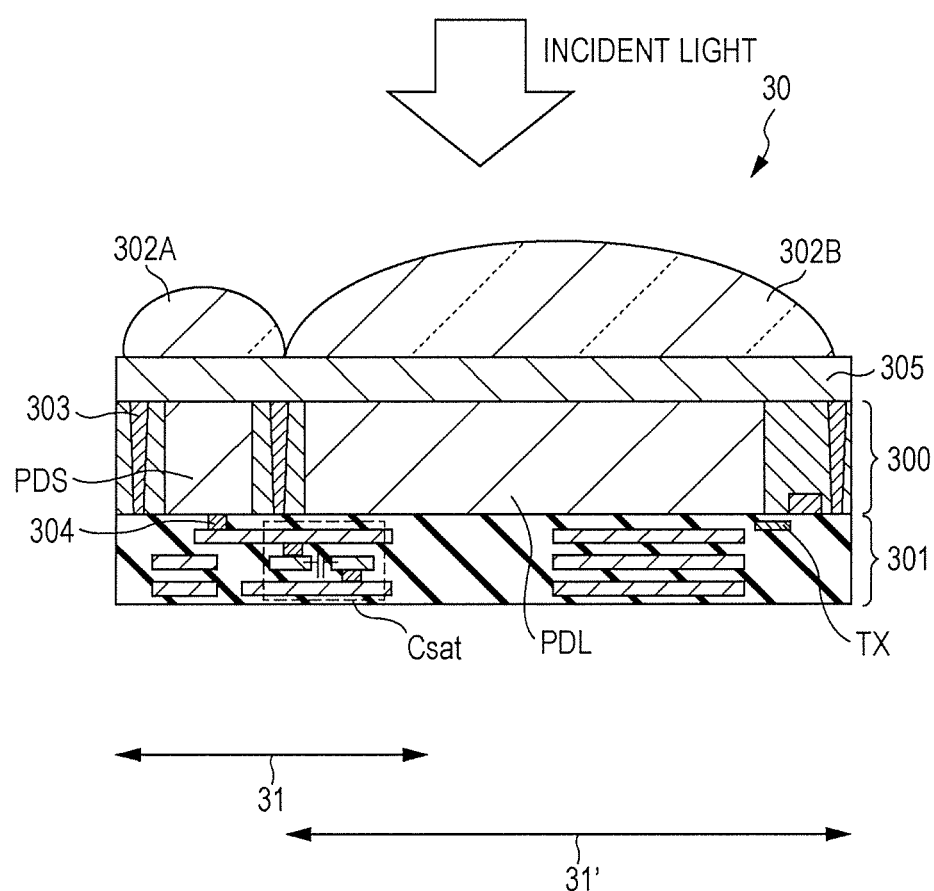
FIG. 8 is a sectional view schematically another device structure of each unit pixel in the imaging device according to exemplary first embodiment.

FIG. 8 schematically illustrates a cross section of another device structure of each unit pixel 30 in the imaging device 100 according to the present embodiment. The capacitive element Csat may be implemented by a metal oxide metal (MOM) capacitor, which forms a capacitance between the same-layer wiring lines, as illustrated in FIG. 6. In addition, a depletion metal oxide semiconductor (DMOS) capacitor using a silicon substrate 300 can also be selected as the capacitive element Csat.

The device structures illustrated in FIGS. 6 to 8 are generally called back-side illumination (BSI) structures. The backside illumination structures have advantages that the wiring line area can be used as a capacitor and a high aperture ratio can be obtained even when the capacitive element Csat is provided.

Figure 9:
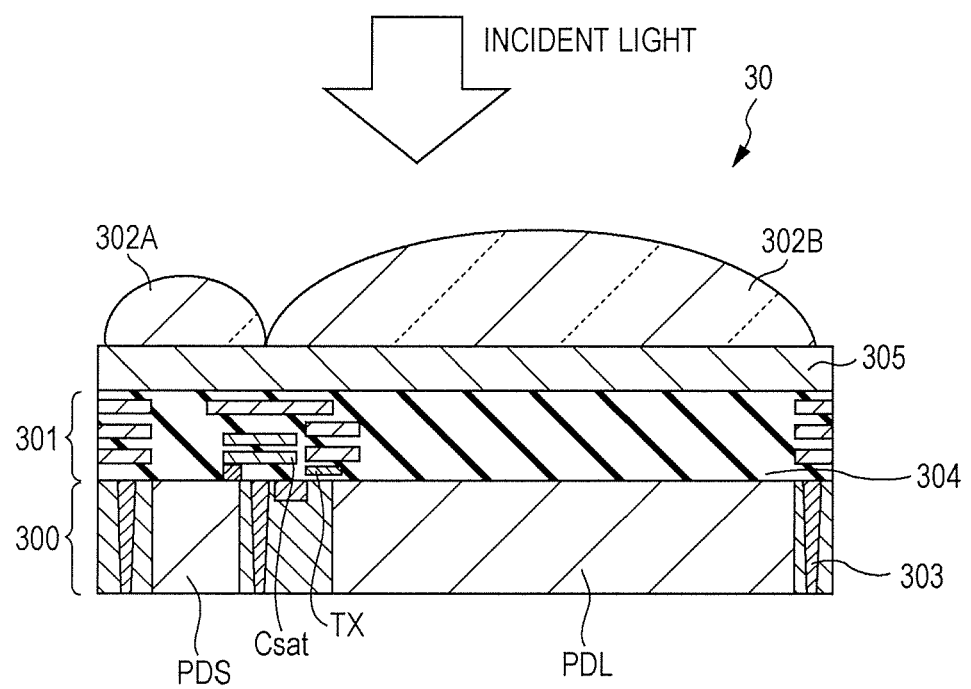
FIG. 9 is a sectional view schematically illustrating yet another device structure of each unit pixel in the imaging device according to the exemplary first embodiment.

FIG. 9 schematically illustrates a cross section of yet another device structure of each unit pixel 30 in the imaging device 100 according to the present embodiment. The illustrated device structure is generally called a front-side illumination (FSI) structure. In this structure, a photoelectric conversion layer is provided at an obverse side of the silicon substrate 300, and incident light from the obverse side is detected. The imaging device in the present disclosure also encompasses front-side illumination device structures.

Figure 10:
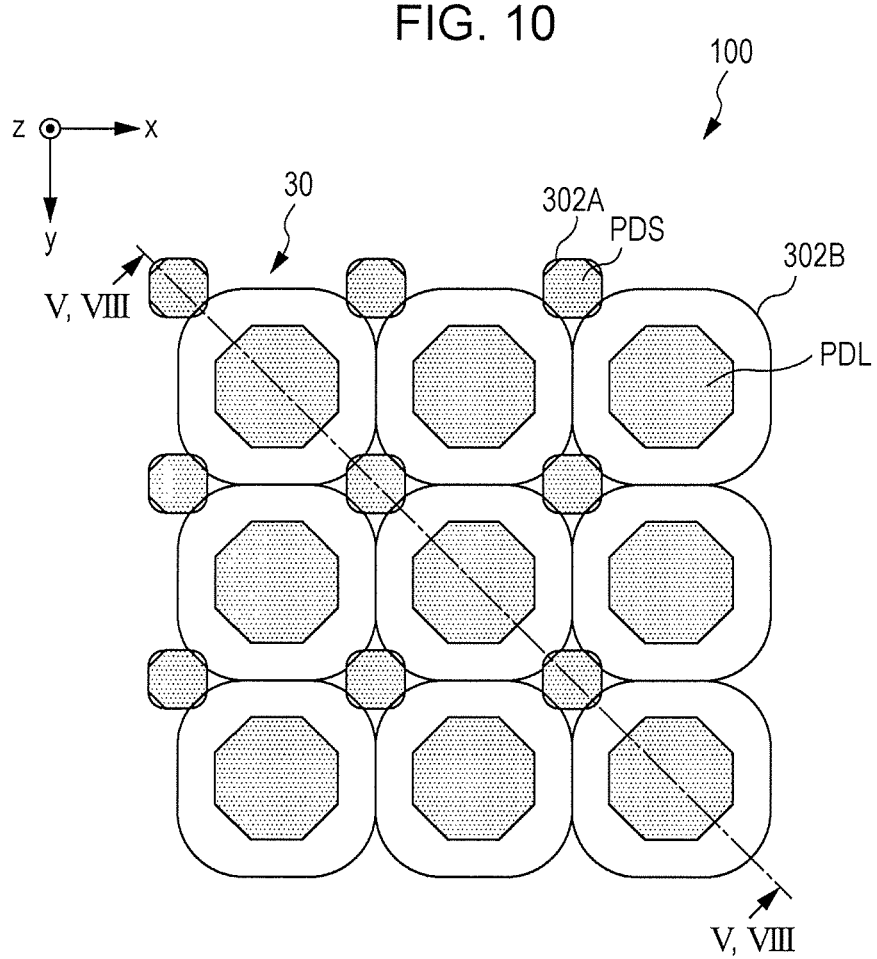
FIG. 10 is a layout diagram of the unit pixels in the imaging device according to the exemplary first embodiment when they are viewed from a bird's eye.

FIG. 10 schematically illustrates a layout example of the unit pixels 30 in the imaging device 100 according to the present embodiment when viewed from a bird's eye. FIG. 10 illustrates the unit pixels 30 in 3 rows and 3 columns. FIG. 5 or 8 schematically illustrates a cross section of the unit pixels 30 along line V, VIII-V, VIII illustrated in FIG. 10. On-chip microlenses 302A are configured so as to focus light onto the corresponding first photoelectric converters PDS. On-chip microlenses 302B are configured so as to focus light onto the corresponding second photoelectric converters PDL. The light-collecting area of each on-chip microlens 302A is larger than the light-collecting area of each on-chip microlens 302B. As illustrated in FIG. 7, a configuration in which each first pixel cell 31 has a lower sensitivity may be selected by eliminating the microlens 302A for the first photoelectric converter PDS. Also, the light-collecting characteristic may be improved by arranging a common microlens for the first photoelectric converter PDS and the second photoelectric converter PDL and by increasing the pitch of the microlenses, as illustrated in FIG. 6.

A wide variety of materials that are generally used to manufacture silicon semiconductor devices may be used as materials of the unit pixels 30.

Variations of the circuit configuration of the unit pixel 30 will be described below with reference to FIGS. 11 to 21.

FIGS. 11 to 22 schematically illustrate variations of the circuit configuration of each unit pixel 30 (specifically, the circuit configuration of each pixel cell) according to the present embodiment. As illustrated in FIGS. 11 to 22, the circuit configuration of each unit pixel 30 according to the present embodiment has variations. In addition to the illustrated configurations, for example, some of the variations can also be combined together.

(First Variation)

Figure 11:
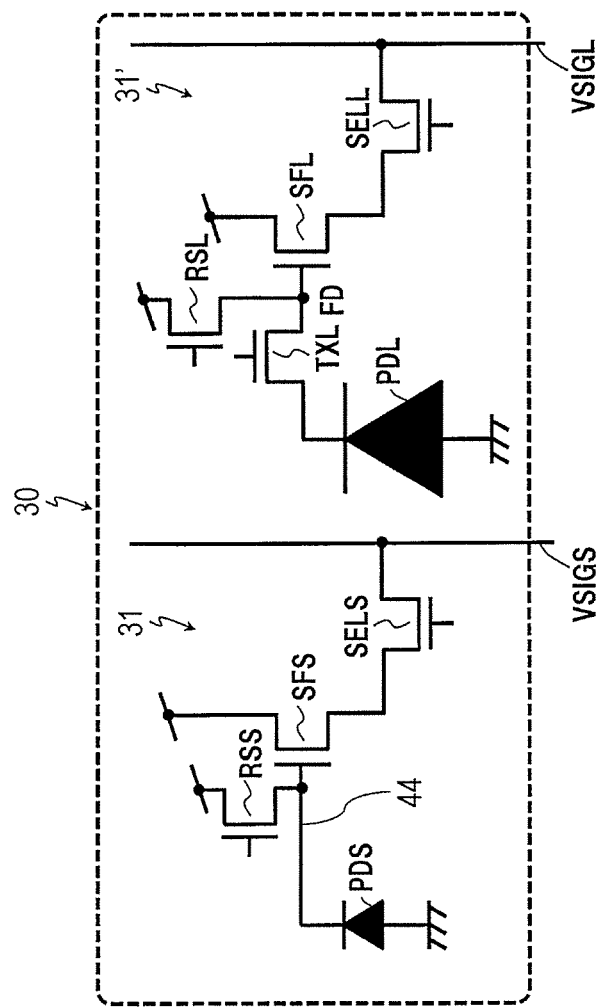
FIG. 11 is a circuit diagram schematically illustrating a variation of each unit pixel according to the exemplary first embodiment.

FIG. 11 illustrates a first variation of the circuit configuration of each unit pixel 30. Unlike the configuration of the first pixel cell 31 illustrated in FIG. 4, the first pixel cell 31 does not have, as a charge storage capacitance, the capacitive element Csat connected to the charge storage node 44. The first pixel cell 31 is a three-transistor-type cell constituted by the reset transistor RSS, the amplifying transistor SFS, the address transistor SELS, and the first photoelectric converter PDS. The configuration of the second pixel cell 31' is the same as the configuration illustrated in FIG. 4.

According to the first variation, a parasitic capacitance viewed from the source electrode of the reset transistor RSS and a gate capacitance of the amplifying transistor accompany the first photoelectric converter PDS. Thus, it is possible to use the parasitically accompanying capacities, instead of additionally providing a capacitive element.

(Second Variation)

Figure 12:
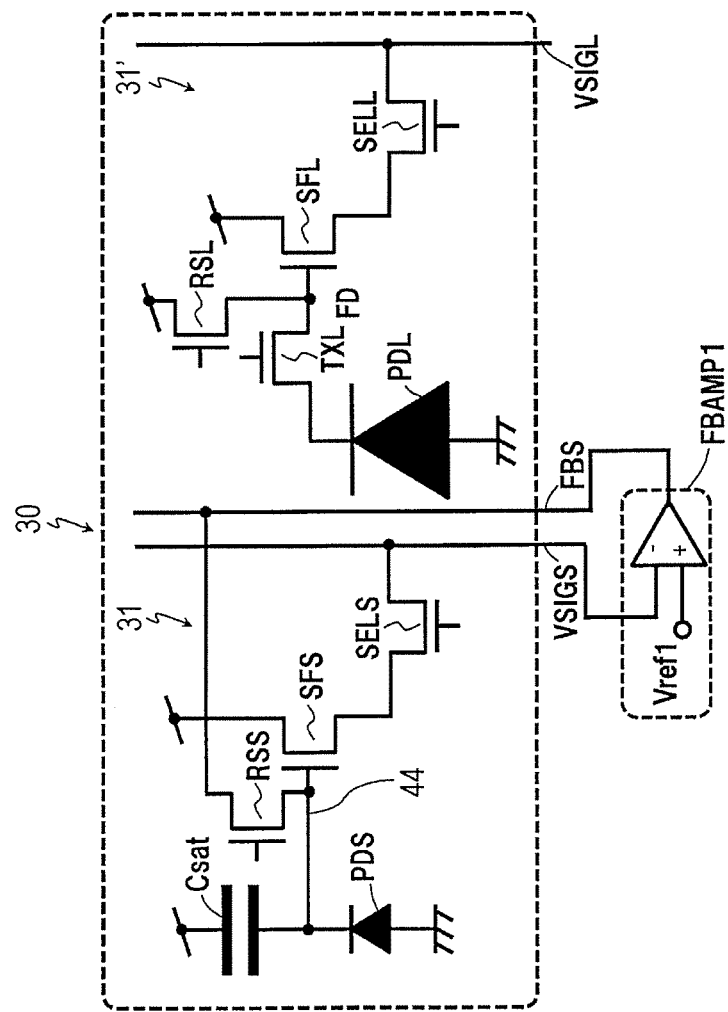
FIG. 12 is a circuit diagram schematically illustrating a variation of each unit pixel according to the exemplary first embodiment.

FIG. 12 illustrates a second variation of the circuit configuration of each unit pixel 30. Unlike the configuration of the first pixel cell 31 illustrated in FIG. 4, the first pixel cell 31 further includes a feedback loop (a column feedback circuit). The column feedback circuit includes the amplifying transistor SFS, the address transistor SELS, an inverting amplifier circuit FBAMP1, and the reset transistor RSS. The column feedback circuit performs feedback to reset the first pixel cell 31. The configuration of the second pixel cell 31' is the same as the configuration illustrated in FIG. 4.

In the first pixel cell 31, during a reset operation, the reset transistor RSS is turned on to fix the charge storage node 44 to a voltage of the drain electrode of the reset transistor RSS. The charge storage node 44 is connected to the gate electrode of the amplifying transistor SFS, and a signal voltage of the charge storage node 44 is output to the vertical signal line VSIGS via the address transistor SELS that is turned on. The signal output to the vertical signal line VSIGS is input to the first inverting amplifier circuit FBAMP1 in the column feedback circuit provided in the corresponding column. A voltage to which a negative gain is applied in the first inverting amplifier circuit FBAMP1 is applied to the drain electrode of the reset transistor RSS through a column feedback signal line FBS.

According to the second variation, reset noise, which is fluctuation of a reset voltage of the charge storage node 44, can be reduced by negative feedback. In addition, in a backside illumination sensor like that illustrated in FIG. 5, the transfer transistor TX does not need to be formed in the silicon substrate 300, so that the aperture ratio can be increased correspondingly.

A tapered reset system in which a tapered voltage, that is, a voltage that increases or decreases gradually with time, is applied to the gate of the reset transistor RSS can also be employed during negative feedback. A drive scheme that is generally used in order to reduce reset noise of a three-transistor CMOS image sensor can be used. One example of the drive scheme is a flash reset system that is a combination of strong inversion reset and weak inversion reset.

(Third Variation)

Figure 13:
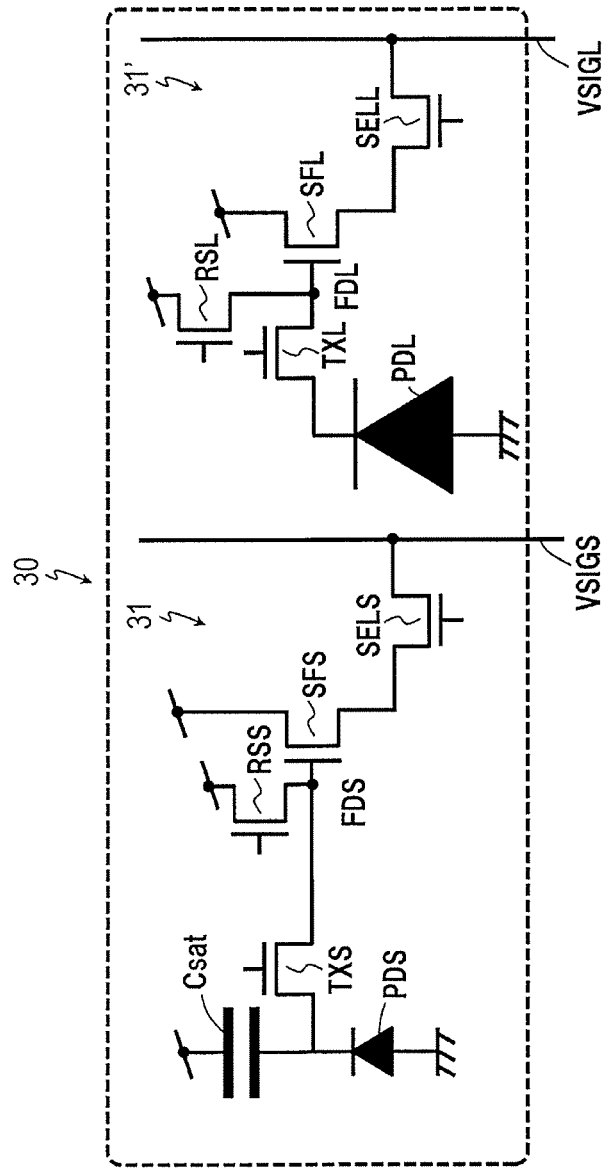
FIG. 13 is a circuit diagram schematically illustrating a variation of each unit pixel according to the exemplary first embodiment.

FIG. 13 illustrates a third variation of the circuit configuration of each unit pixel 30. Unlike the configuration of the first pixel cell 31 illustrated in FIG. 4, the first pixel cell 31 includes a transfer transistor TXS. The configuration of the second pixel cell 31' is the same as the configuration illustrated in FIG. 4. In this configuration, each of the first pixel cell 31 and the second pixel cell 31' further has the transfer transistor and thus has a four-transistor-type configuration. Only the first pixel cell 31 has the capacitive element Csat for high saturation.

According to the third variation, charges generated in all pixel cells is temporarily transferred to a charge holding portion, that is, to floating diffusions FDS and FDL, thereby making it possible to realize a global shutter operation.

The first pixel cell 31 may further include a column feedback circuit, as in the second variation. That is, a configuration that reduces reset noise may be employed by providing the feedback circuit illustrated in FIG. 12 for each of the reset transistors RSS and RSL.

(Fourth Variation)

Figure 14:
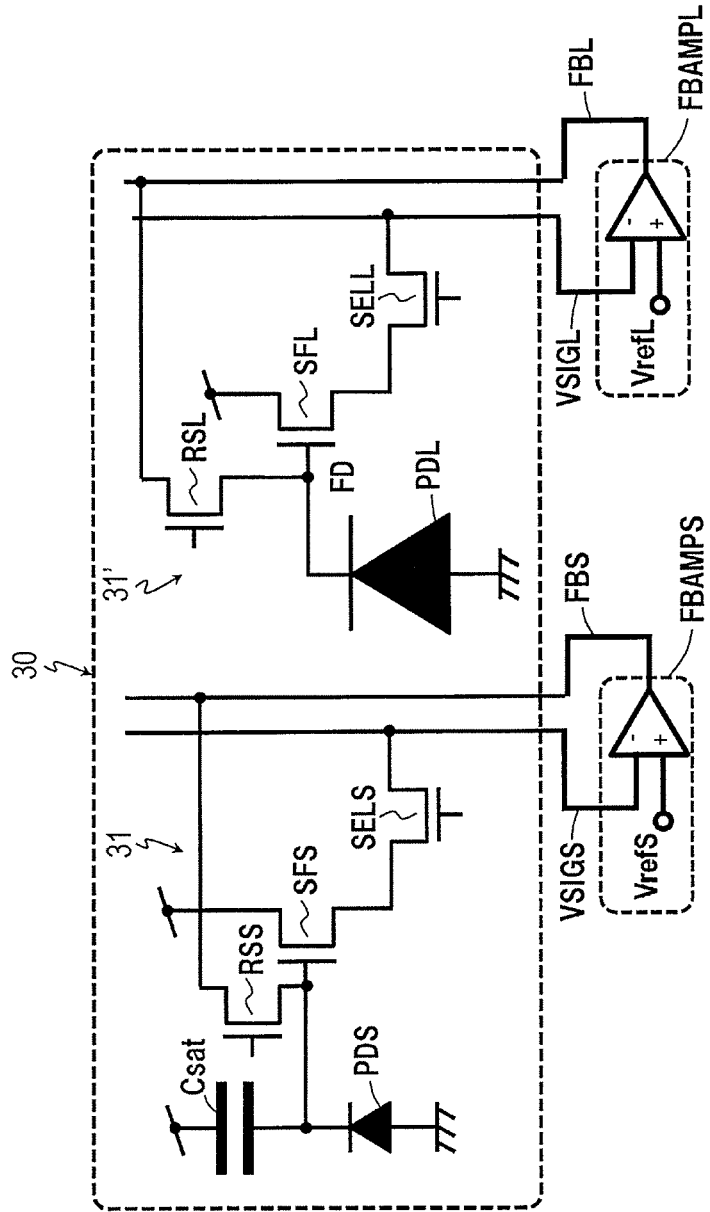
FIG. 14 is a circuit diagram schematically illustrating a variation of each unit pixel according to the exemplary first embodiment.

FIG. 14 illustrates a fourth variation of the circuit configuration of each unit pixel 30. Unlike the circuit configuration illustrated in FIG. 4, each of the first pixel cell 31 and the second pixel cell 31' has a three-transistor-type configuration and has a column feedback circuit including an inverting amplifier circuit FBAMPS or an inverting amplifier circuit FBAMPL.

According to the fourth variation, since neither the first pixel cell 31 nor the second pixel cell 31' has a transfer transistor, it is possible to further increase the area of the second photoelectric converter PDL in the second pixel cell 31', which requires a high sensitivity.

(Fifth and Sixth Variations)

Figure 15:
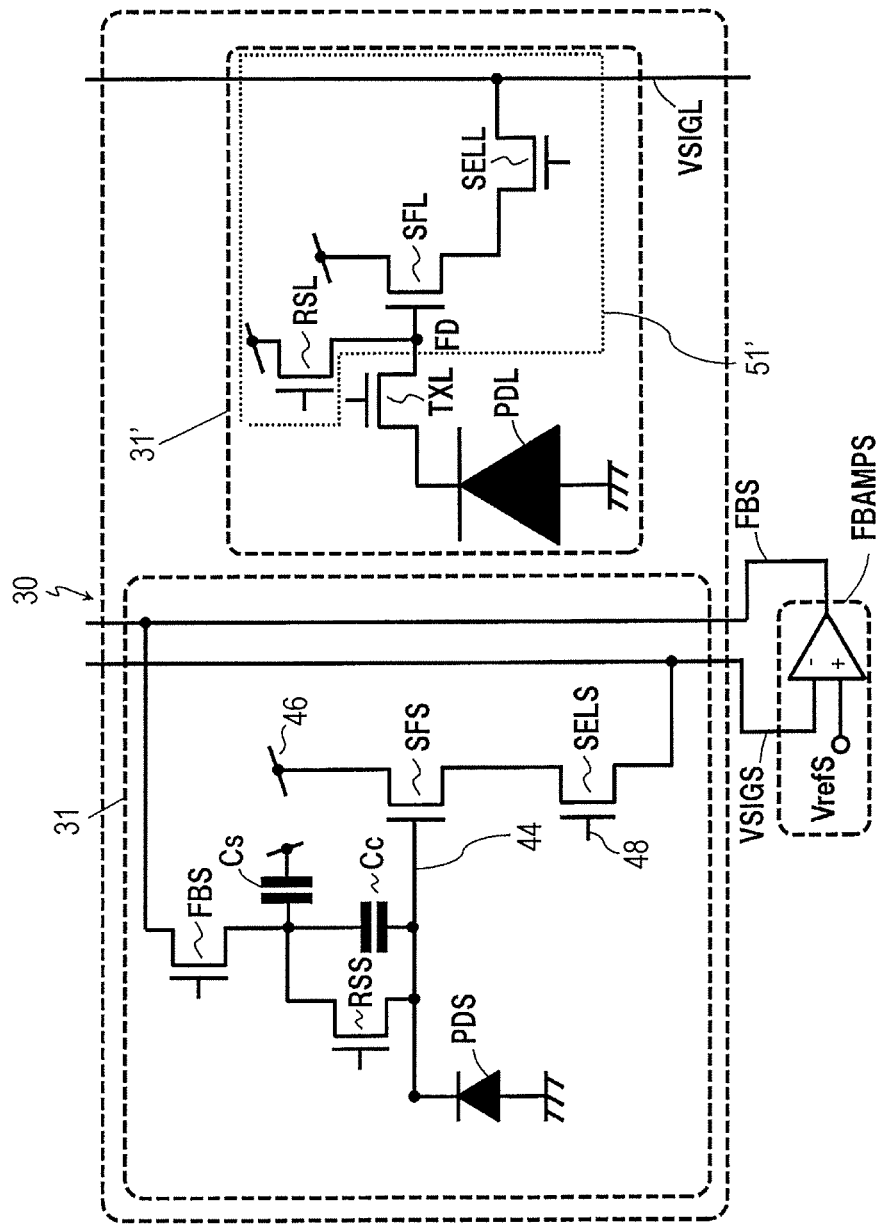
FIG. 15 is a circuit diagram schematically illustrating a variation of each unit pixel according to the exemplary first embodiment.

FIG. 15 illustrates a fifth variation of the circuit configuration of each unit pixel 30. The configuration of the first pixel cell 31 in the fifth variation differs from the configuration of the first pixel cell 31 illustrated in FIG. 12. That is, the first pixel cell 31 in the fifth variation further includes a capacitive element Cc, a capacitive element Cs, and a feedback control transistor FBS. It is desirable that the capacitance value of the capacitive element Cc be smaller than the capacitance value of the capacitive element Cs. The first pixel cell 31 does not have the capacitive element Csat illustrated in FIG. 12.

Figure 16:
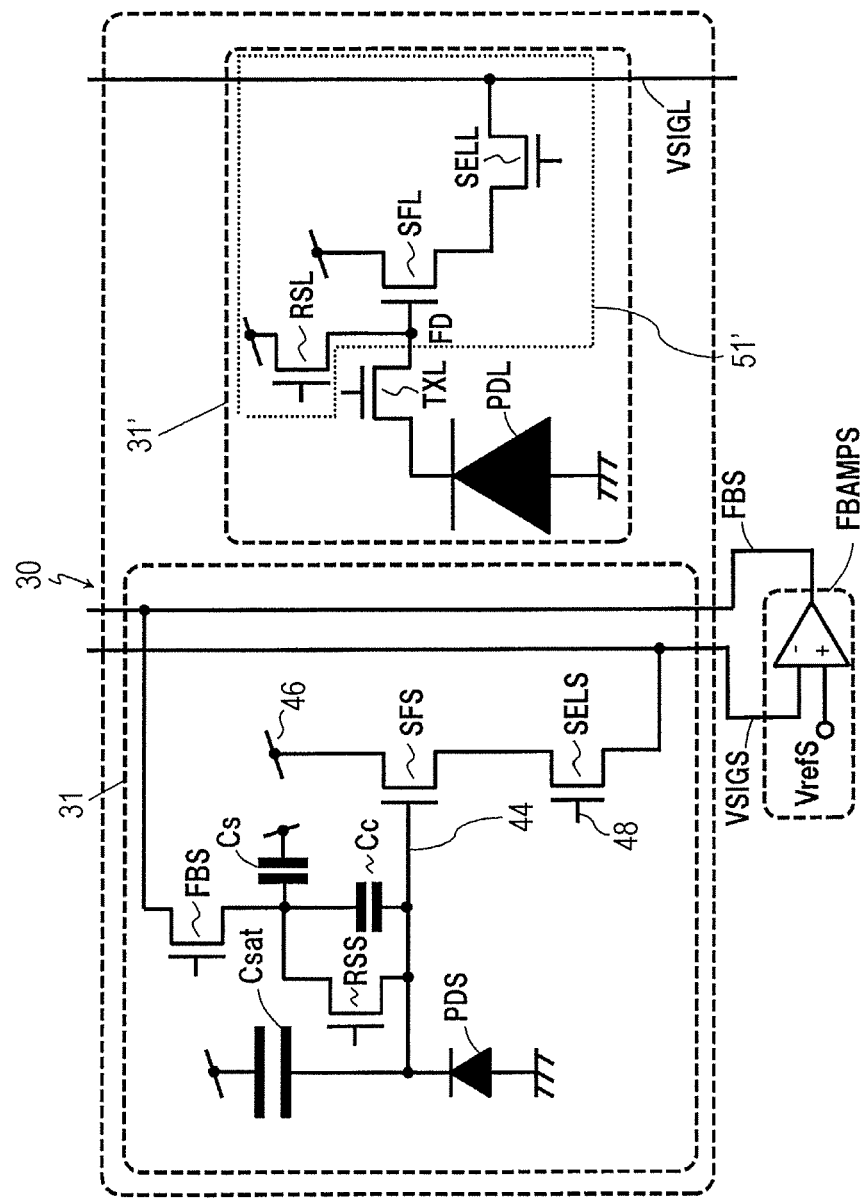
FIG. 16 is a circuit diagram schematically illustrating a variation of each unit pixel according to the exemplary first embodiment.

FIG. 16 illustrates a modification of the fifth variation of the circuit configuration of each unit pixel 30. In the modification of the fifth variation, the capacitive element Csat is connected to the first photoelectric converter PDS.

According to the fifth variation and the modification thereof, noise can be attenuated in accordance with the ratio of the capacitance value of the capacitive element Cs to the capacitance value of the capacitive element Cc. As a result, the advantage of the reset noise reduction can be expected, compared with the configuration illustrated in FIG. 12.

Figure 17:
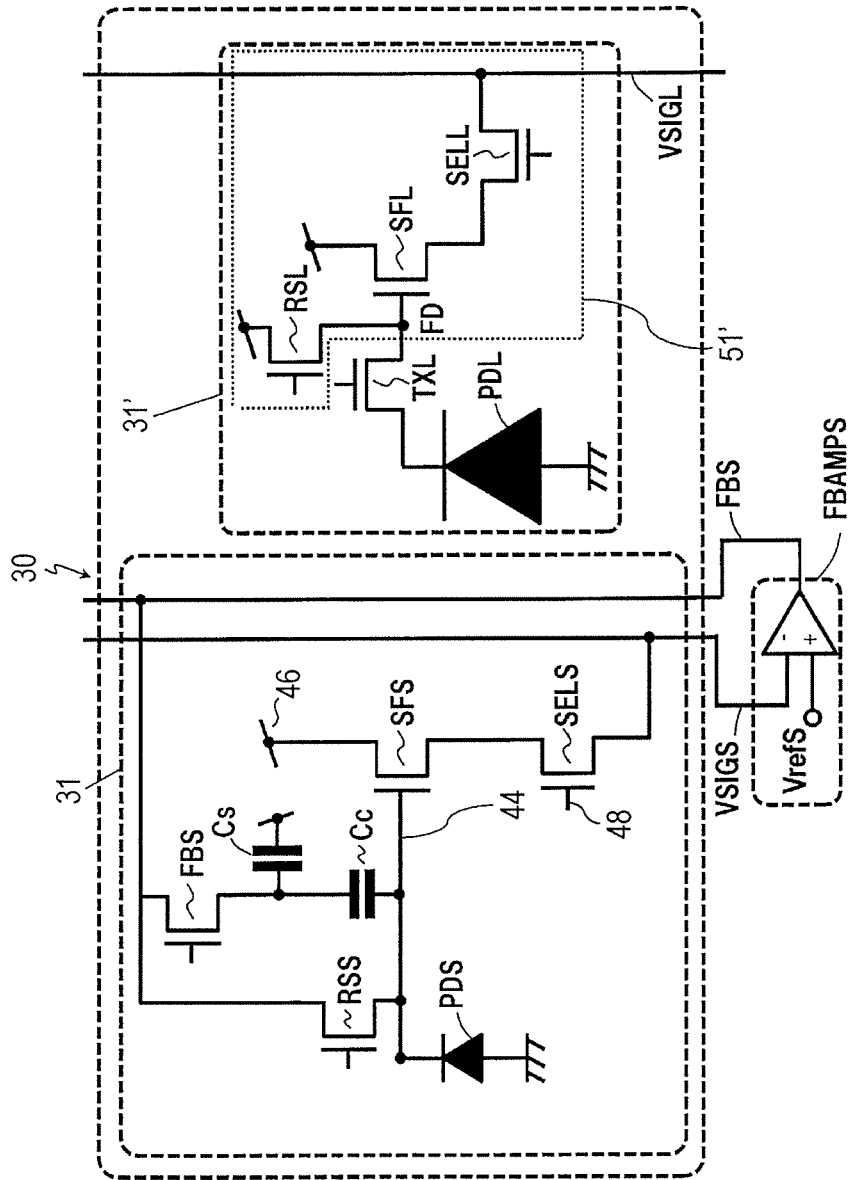
FIG. 17 is a circuit diagram schematically illustrating a variation of each unit pixel according to the exemplary first embodiment.

FIG. 17 illustrates a sixth variation of the circuit configuration of each unit pixel 30. In the sixth variation, an element to which the source or drain of the reset transistor RSS is connected differs from that in the fifth variation. An advantage that is the same as that in the fifth variation can also be expected in the sixth variation.

(Seventh and Eighth Variations)

Figure 18:
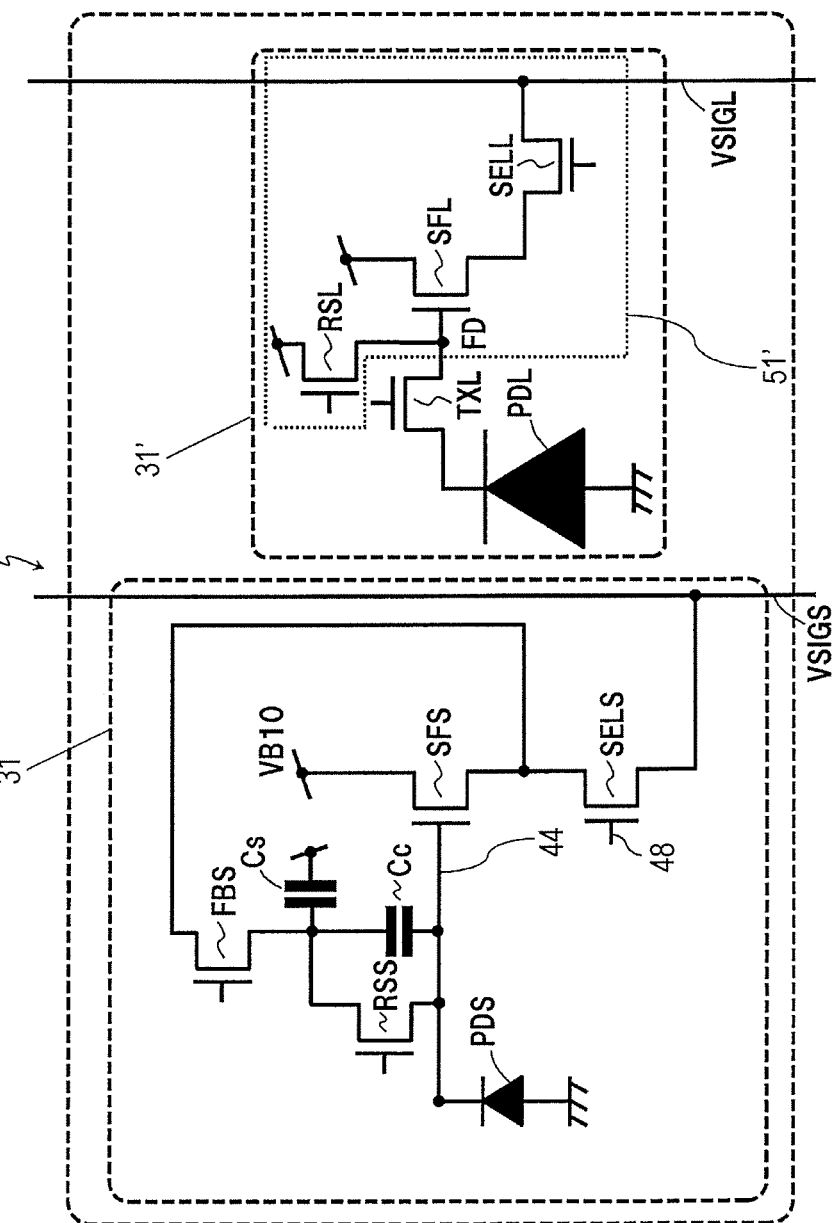
FIG. 18 is a circuit diagram schematically illustrating a variation of each unit pixel according to the exemplary first embodiment.

FIG. 18 illustrates a seventh variation of the circuit configuration of each unit pixel 30. Compared with the configuration illustrated in FIG. 15, the first pixel cell 31 has an in-pixel feedback circuit that performs negative feedback in the pixel. The in-pixel feedback circuit includes the amplifying transistor SFS, the feedback control transistor FBS, the capacitive element Cs, and the capacitive element Cc. A plurality of reference voltages is applied to a drain VB10 of the amplifying transistor SFS in accordance with an operation mode.

According to the seventh variation, noise can be attenuated in accordance with the ratio of the capacitance value of the capacitive element Cs to the capacitance value of the capacitive element Cc, and also high-speed drive can be performed since speed reduction when a column feedback circuit is used does not occur.

Figure 19:
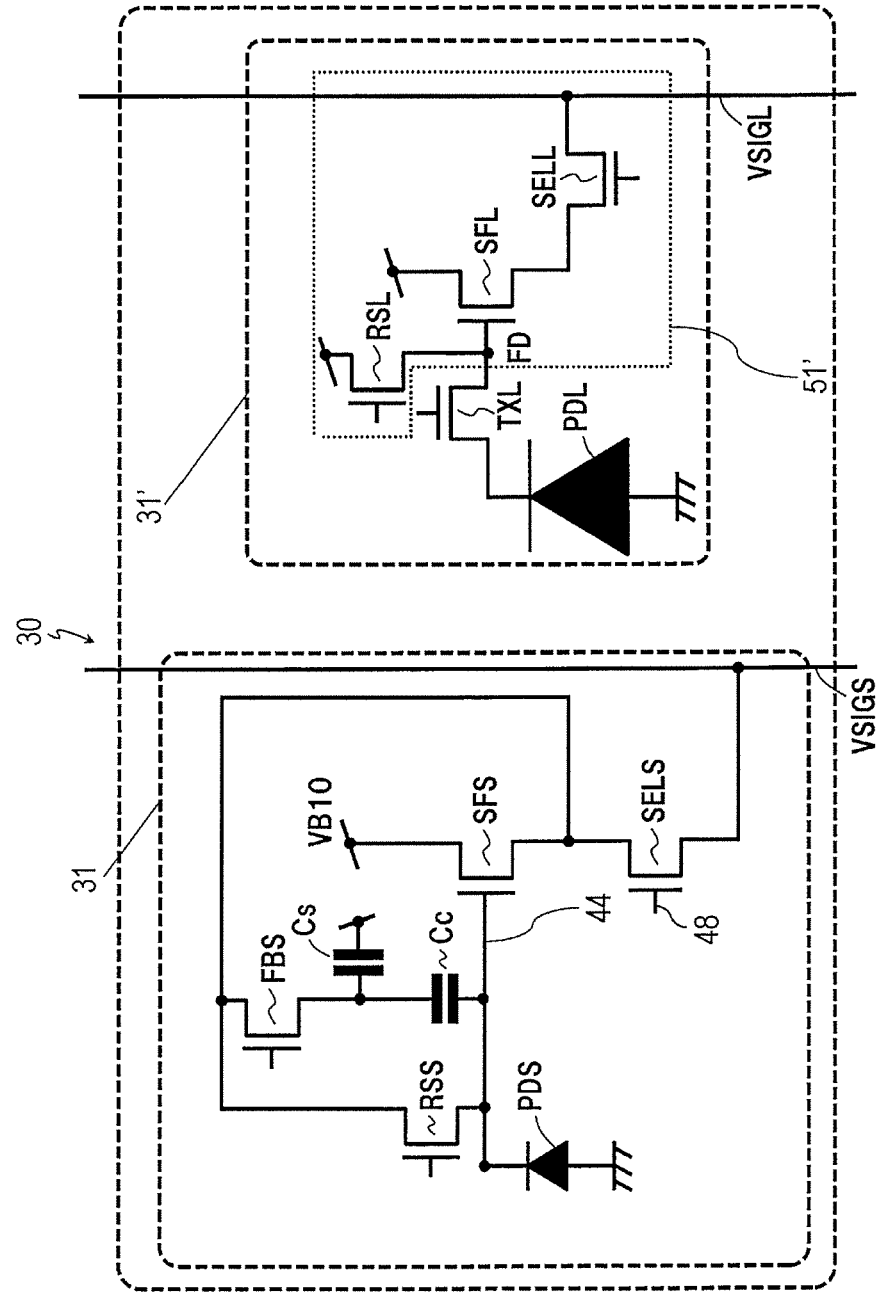
FIG. 19 is a circuit diagram schematically illustrating a variation of each unit pixel according to the exemplary first embodiment.

FIG. 19 illustrates an eighth variation of the circuit configuration of each unit pixel 30. In the eighth variation, an element to which the source or drain of the reset transistor RSS is connected differs from that in the seventh variation. According to the eighth variation, a high-speed operation and reset noise reduction using in-pixel feedback reset can be realized, as in the seventh variation.

(Ninth and Tenth Variations)

Figure 20:
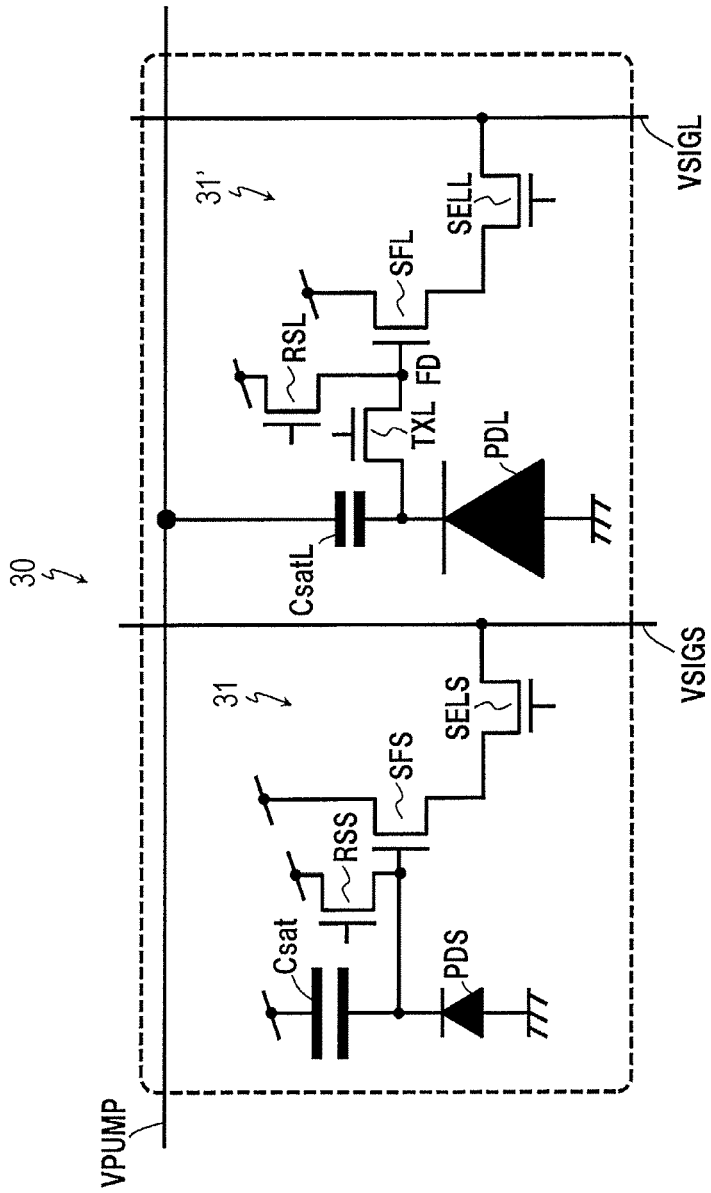
FIG. 20 is a circuit diagram schematically illustrating a variation of each unit pixel according to the exemplary first embodiment.

FIG. 20 illustrates a ninth variation of the circuit configuration of each unit pixel 30. Compared with the configuration illustrated in FIG. 4, the second pixel cell 31' also has a capacitive element CsatL connected to the second photoelectric converter PDL, as in the first pixel cell 31. A signal line VPUMP is connected to the capacitive element CsatL.

According to the ninth variation, application of a pulse voltage to the signal line VPUMP makes it possible to increase the voltage level of the second photoelectric converter PDL in the high-sensitivity cell via the capacitive element CsatL. As a result, a sufficient signal range can be ensured even during low-voltage operation. In addition, the second pixel cell 31', which is a high-sensitivity cell, may have a feedback circuit. In such a case, it is possible to perform low-noise operation through reduction of reset noise, in addition to the low-voltage operation. When the feedback circuit has a plurality of capacitive elements, resistance elements, and transistor elements, in addition to the reset transistor RSL, it is possible to perform negative feedback with a higher gain.

Figure 21:
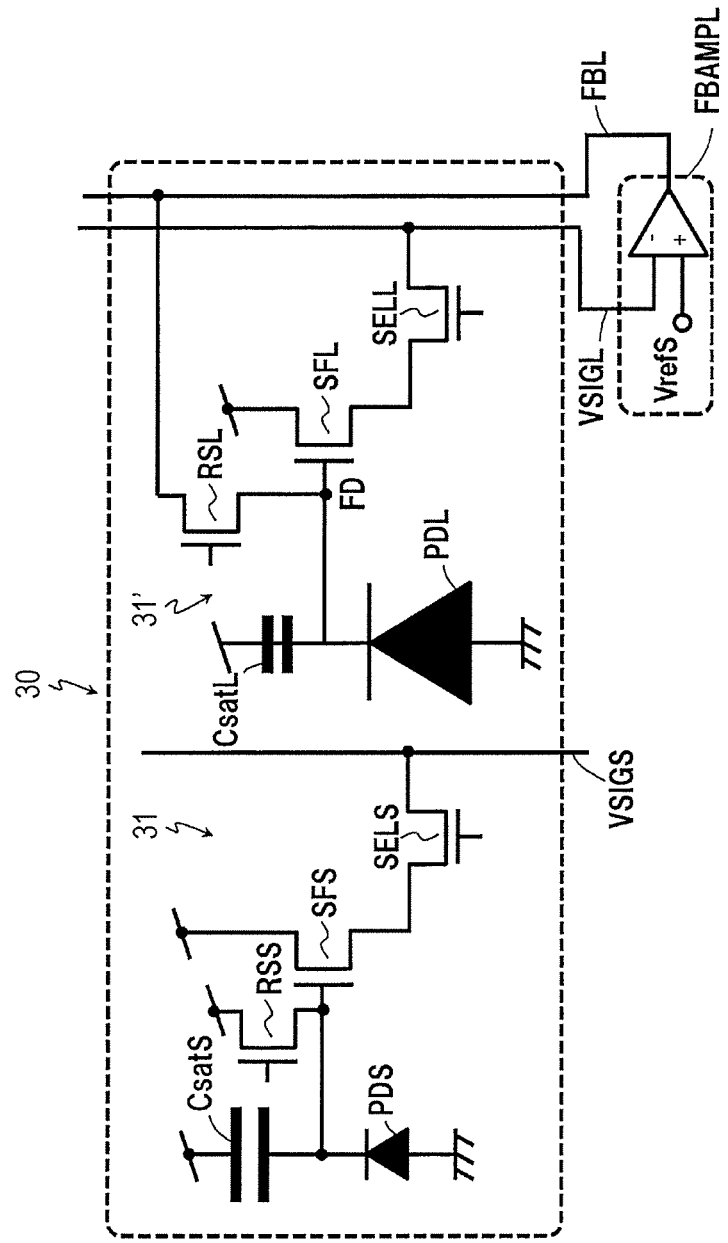
FIG. 21 is a circuit diagram schematically illustrating a variation of each unit pixel according to the exemplary first embodiment.

FIG. 21 illustrates a tenth variation of the circuit configuration of each unit pixel 30. The second pixel cell 31', which is a high-sensitivity cell, may have a column feedback circuit. According to this configuration, higher sensitivity can be realized through selective reduction of noise in the second pixel cell 31'. A reset system in this case may be the high-gain column feedback reset system described above with reference to FIG. 16 or 17 or the in-pixel feedback reset system described above with reference to FIG. 18 or 19. With regard to the above described variations, details of the reduction of reset noise by using feedback are described in International Publication No. 2012/147302 and U. S. Unexamined Patent Application Publication No. 2016/0190187.

The contents of International Publication No. 2012/147302 and U. S. Unexamined Patent Application Publication No. 2016/0190187 are incorporated herein by reference in their entirety.

(11th Variation)

Figure 22:
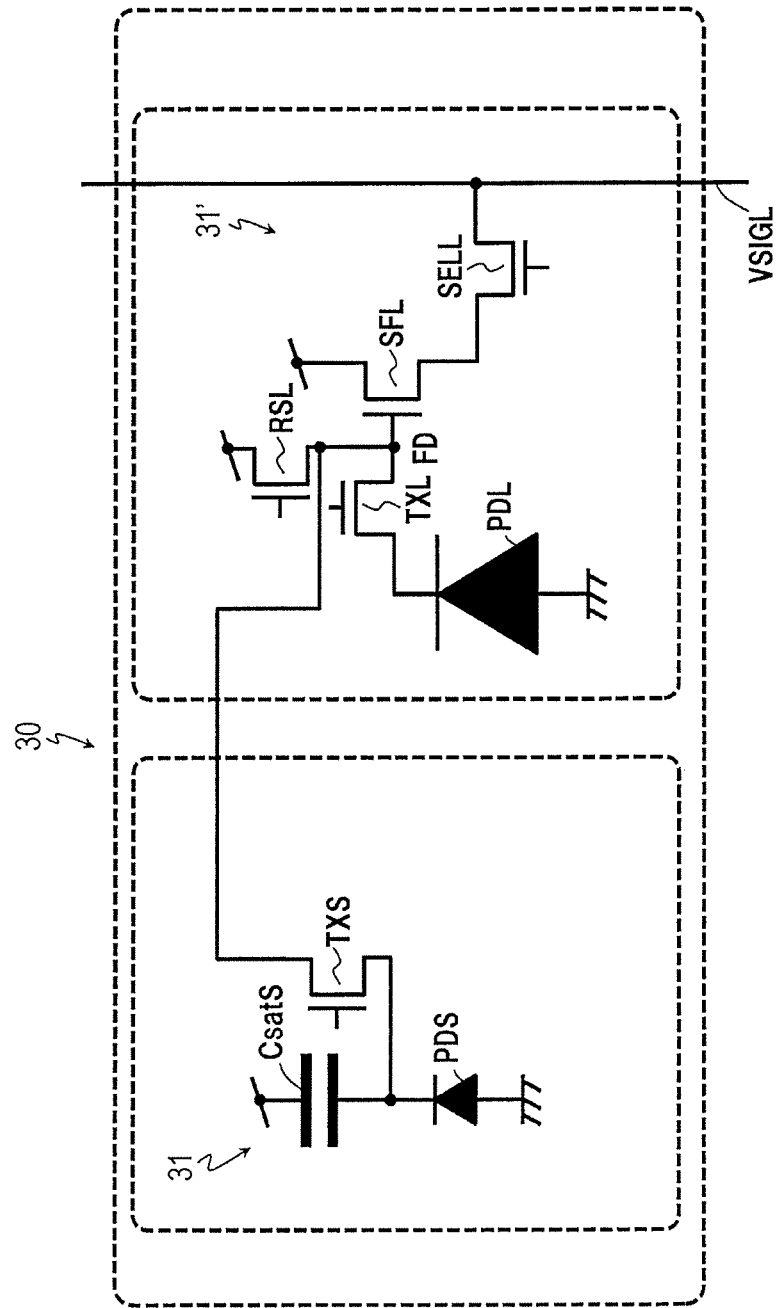
FIG. 22 is a circuit diagram schematically illustrating a variation of each unit pixel according to the exemplary first embodiment.

FIG. 22 illustrates an 11th variation of the circuit configuration of each unit pixel 30. The first pixel cell 31 and the second pixel cell 31' share a charge detection circuit that has an amplifying transistor SFL and an address transistor SELL. The first pixel cell 31 and the second pixel cell 31' share the reset transistor RSL as a transistor for reset. The transfer transistors TXS are TXL are used to select which of the first pixel cell 31 and the second pixel cell 31' is to be reset or read out.

According to the 11th variation, it is possible to reduce the number of transistors used in the entire unit pixel 30. As a result, it is possible to increase the area of the second photoelectric converter PDL in the unit pixel 30.

(Drive Method for Imaging Device 100)

One example of an operation sequence of the imaging device 100 will now be described with reference to FIG. 23.

Figure 23:
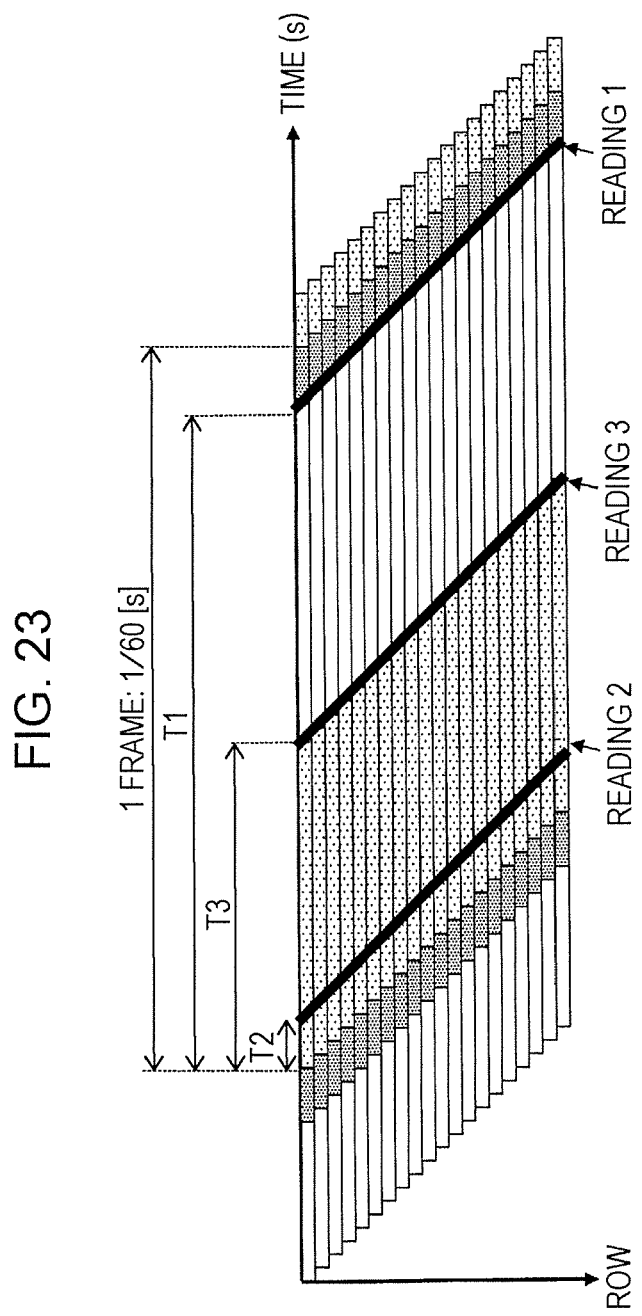
FIG. 23 is a timing chart illustrating a timing of exposure and a read operation in one cycle (one frame) period in the imaging device according to the exemplary first embodiment.

FIG. 23 schematically illustrates exposure and a reading operation in one cycle (one frame) period in the imaging device 100. The horizontal axis represents time, and the vertical axis represents a row to be read out. FIG. 23 illustrates the state of the so-called rolling shutter readout. In the imaging device 100, when the first pixel cell 31 and the second pixel cell 31' are used to perform exposure and a readout operation at the same timing, the dynamic range can be increased.

In the device configuration illustrated in FIG. 5, difference in sensitivity of about one digit occurs between the first pixel cell 31 and the second pixel cell 31'. Thus, even when the same exposure and readout are performed, the dynamic range can be increased by about one digit compared to a general pixel.

In the present embodiment, in order to further increase the dynamic range, each of the first pixel cell 31 and the second pixel cell 31' has independent exposure and readout timings. In one cycle of an imaging operation, the second pixel cell 31' performs exposure in a first storage time T1, and the first pixel cell 31 performs exposure in second storage times T2 and T3, which are shorter than the first storage time T1. A specific description will be given below.

In the present embodiment, for example, one cycle is 1/60th of a second. First, the second pixel cells 31' performs exposure in the storage time T1, which is close to one cycle, and after the storage time passes, charges in the second pixel cells 31' are sequentially read out for each row (readout 1). When the readout for each row is completed, charges stored in all the second pixel cells 31' in the read row are reset.

In the first pixel cells 31, non-destructive readout is performed at least twice in one cycle. For example, first exposure is performed in the storage time T2, which is 1/30th of one cycle period (i.e., 1/1800th of a second), and after the exposure is completed, readout (readout 2) is performed. Thereafter, second exposure is performed in the storage time T3, which is one-half of one cycle period (that is, 1/120th of a second), without performing resetting of the stored charges, and after the exposure is completed, readout (readout 3) is performed. In such an operation sequence, three pieces of imaging data exposure times of which are different from each other can be obtained in one cycle period. Although the dynamic range can be improved by about 1 digit when the same exposure and readout are performed, as described above, combining the pieces of imaging data makes it possible to generate an image with a dynamic range that is additionally higher by about 1.5 digits, that is, an image with a dynamic range that is higher by a total of about 2.5 digits compared to a general pixel.

As described above, the first pixel cell 31 functions as an imaging region that images a bright subject, which has a large amount of light. A desirable characteristic requested for the first pixel cell 31 is that the number of saturation electrons is large (i.e., the saturation is high). On the other hand, the second pixel cell 31' functions as an imaging region that images a dark subject, which has a small amount of light. A desirable characteristic requested for the second pixel cell 31' is that the amount of random noise is small. The second pixel cell 31' may have a small number of saturation electrons, that is, may be low in the saturation. According to the present embodiment, it is possible to provide the imaging device 100 that can satisfy the above-described characteristics.

Second Embodiment

An imaging module 200 according to the present embodiment will be described with reference to FIG. 24.

Figure 24:
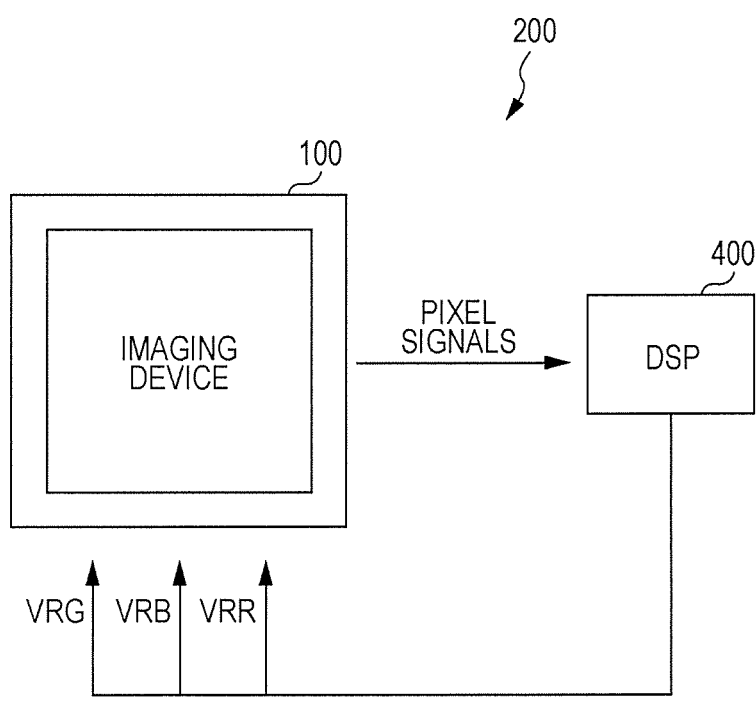
FIG. 24 is a diagram schematically illustrating functional blocks in an imaging module including the imaging device.

FIG. 24 schematically illustrates functional blocks in the imaging module 200 including the imaging device 100.

The imaging module 200 has the imaging device 100 according to the first embodiment and a digital signal processor (DSP) 400. The imaging module 200 processes signals obtained by the imaging device 100 and outputs the processed signals to outside.

The DSP 400 functions as a signal processing circuit that processes the signals output from the imaging device 100. That is, the DSP 400 receives digital pixel signals output from the imaging device 100. The DSP 400 performs processing, for example, gamma correction processing, color interpolation processing, space interpolation processing, and automatic white balance processing. The DSP 400 may be a microcomputer that controls the imaging device 100 in accordance with various settings specified by a user and that integrates operations of the entire imaging module 200.

The DSP 400 processes digital pixel signals output from the imaging device 100 to determine optimum reset voltages (VRG, VRB, and VRR). The DSP 400 feeds back the reset voltages to the imaging device 100. Herein, VRG, VRB, and VRR indicate a reset voltage for green (G) pixels, a reset voltage for blue (B) pixels, and a reset voltage for red (R) pixels, respectively. The reset voltages may be feedback signals transmitted from the feedback signal lines FBS or the vertical signal lines 45. The imaging device 100 and the DSP 400 can also be manufactured as one semiconductor device (the so-called System on a Chip (SoC)). This makes it possible to miniaturize electronic equipment using the imaging device 100.

Naturally, it is also possible to put only the imaging device 100 into production without incorporating it into a module. In such a case, a signal processing circuit may be externally connected to the imaging device 100 to perform signal processing outside the imaging device 100.

The imaging device according to the present disclosure is useful for image sensors used in cameras, for example, digital cameras and vehicle-mounted cameras.

The imaging device according to the present disclosure is applicable to various sensor systems and camera systems, such as digital still cameras, medical cameras, camera for monitoring, vehicle-mounted cameras, digital single-lens reflex cameras, and digital mirrorless interchangeable lens cameras.

What is claimed is:

1. An imaging device comprising:
a semiconductor substrate;
a first photoelectric converter that is located in the semiconductor substrate and that generates a first signal charge by photoelectric conversion;
a first node to which the first signal charge is input;
a capacitor having a first terminal coupled to the first node;
a second photoelectric converter that is located in the semiconductor substrate and that generates a second signal charge by photoelectric conversion;
a second node to which the second signal charge is input;
a transistor having a gate coupled to the second node; and
a switch element coupled between the first node and the second node, wherein
a number of saturation charges of a first imaging cell including the first photoelectric converter and the capacitor is greater than a number of saturation charges of a second imaging cell including the second photoelectric converter.

2. The imaging device according to claim 1, wherein the first signal charge input to the first node is input to the second node.

3. The imaging device according to claim 1, wherein the transistor amplifies a voltage corresponding to an amount of the first signal charge input to the second node.

4. The imaging device according to claim 1, wherein the first photoelectric converter and the second photoelectric converter are photodiodes.

5. The imaging device according to claim 1, further comprising:
a first microlens; and
a second microlens, wherein
a light-collecting area of the second microlens is greater than a light-collecting area of the first microlens.

6. The imaging device according to claim 1, wherein an area of the second photoelectric converter is greater than an area of the first photoelectric converter.

7. The imaging device according to claim 1, wherein the capacitor stores the first signal charge and that does not store the second signal charge.

8. The imaging device according to claim 1, wherein the second photoelectric converter is coupled to the first terminal of the capacitor through more switching elements than the first photoelectric converter is.

9. The imaging device according to claim 1, wherein the capacitor is directly coupled to the first node.

10. The imaging device according to claim 1, wherein the first terminal of the capacitor is directly coupled to the first photoelectric converter.

11. The imaging device according to claim 1, wherein sensitivity of the second imaging cell is greater than sensitivity of the first imaging cell.

12. An imaging device comprising:
a semiconductor substrate;
a first photoelectric converter that is located in the semiconductor substrate and that generates a first signal charge by photoelectric conversion;
a capacitor having a first terminal configured to be electrically coupled to the first photoelectric converter;
a second photoelectric converter that is located in the semiconductor substrate and that generates a second signal charge by photoelectric conversion;
a transistor having a gate configured to be electrically coupled to the second photoelectric converter; and a switch element coupled between the gate of the transistor and the first terminal of the capacitor, wherein
a number of saturation charges of a first imaging cell including the first photoelectric converter and the capacitor is greater than a number of saturation charges of a second imaging cell including the second photoelectric converter.

13. The imaging device according to claim 12, wherein the first photoelectric converter and the second photoelectric converter are photodiodes.

14. The imaging device according to claim 12, further comprising:
a first microlens; and
a second microlens, wherein
a light-collecting area of the second microlens is greater than a light-collecting area of the first microlens.

15. The imaging device according to claim 12, wherein an area of the second photoelectric converter is greater than an area of the first photoelectric converter.

16. The imaging device according to claim 12, wherein the capacitor stores the first signal charge and that does not store the second signal charge.

17. The imaging device according to claim 12, wherein the second photoelectric converter is coupled to the first terminal of the capacitor through more switching elements than the first photoelectric converter is.

18. The imaging device according to claim 12, wherein the first terminal of the capacitor is directly coupled to the first photoelectric converter.

19. The imaging device according to claim 12, wherein sensitivity of the second imaging cell is greater than sensitivity of the first imaging cell.

* * * * *